United States Patent
Nakagawa et al.

(10) Patent No.: US 11,271,544 B2
(45) Date of Patent: Mar. 8, 2022

(54) MULTIPLEXER, HIGH-FREQUENCY FRONT END CIRCUIT, AND COMMUNICATION DEVICE

(71) Applicant: Murata Manufacturing Co., Ltd., Nagaokakyo (JP)

(72) Inventors: Ryo Nakagawa, Nagaokakyo (JP); Shou Nagatomo, Nagaokakyo (JP); Hideki Iwamoto, Nagaokakyo (JP); Tsutomu Takai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 128 days.

(21) Appl. No.: 16/783,202

(22) Filed: Feb. 6, 2020

(65) Prior Publication Data
US 2020/0177157 A1 Jun. 4, 2020

Related U.S. Application Data

(63) Continuation of application No. PCT/JP2018/027358, filed on Jul. 20, 2018.

(30) Foreign Application Priority Data

Aug. 9, 2017 (JP) .............................. JP2017-154239

(51) Int. Cl.
*H03H 9/25* (2006.01)
*H03H 9/02* (2006.01)
(Continued)

(52) U.S. Cl.
CPC .......... *H03H 9/25* (2013.01); *H03H 9/02559* (2013.01); *H03H 9/02574* (2013.01);
(Continued)

(58) Field of Classification Search
CPC .. H03H 9/25; H03H 9/02559; H03H 9/02574; H03H 9/14502; H03H 9/6406; H03H 9/6483; H03H 9/725
See application file for complete search history.

(56) References Cited

U.S. PATENT DOCUMENTS

| | | | |
|---|---|---|---|
| 2010/0182101 A1 | 7/2010 | Suzuki | |
| 2010/0244631 A1 | 9/2010 | Kobayashi et al. | |

(Continued)

FOREIGN PATENT DOCUMENTS

| | | | |
|---|---|---|---|
| JP | 2010-187373 A | 8/2010 | |
| JP | 2010-232725 A | 10/2010 | |

(Continued)

OTHER PUBLICATIONS

Official Communication issued in International Patent Application No. PCT/JP2018/027358, dated Sep. 25, 2018.

*Primary Examiner* — Samuel S Outten
(74) *Attorney, Agent, or Firm* — Keating & Bennett, LLP

(57) ABSTRACT

A multiplexer includes N acoustic wave filters each including one end connected in common and having a different pass band, in which when the N acoustic wave filters are in order from a side of a lower frequency of the pass band, at least one n-th acoustic wave filter among the N acoustic wave filters excluding an acoustic wave filter having the highest frequency of the pass band includes one or more acoustic wave resonators including a support substrate, a silicon nitride film laminated on the support substrate, a silicon oxide film laminated on the silicon nitride film, a piezoelectric body laminated on the silicon oxide film, and an IDT electrode provided on the piezoelectric body. All acoustic wave filters having a pass band in a higher frequency than a frequency of a pass band of the n-th acoustic wave filter satisfy $f_{h1\_t}^{(n)} > f_u^{(m)}$ or $f_{h1\_t}^{(n)} < f_l^{(m)}$.

19 Claims, 20 Drawing Sheets

(51) Int. Cl.
*H03H 9/145* (2006.01)
*H03H 9/64* (2006.01)
*H03H 9/72* (2006.01)

(52) U.S. Cl.
CPC ...... *H03H 9/14502* (2013.01); *H03H 9/6406* (2013.01); *H03H 9/6483* (2013.01); *H03H 9/725* (2013.01)

(56) References Cited

U.S. PATENT DOCUMENTS

| | | |
|---|---|---|
| 2016/0261249 A1 | 9/2016 | Takamine |
| 2017/0093371 A1* | 3/2017 | Takamine ............ H03H 9/6436 |
| 2018/0123556 A1 | 5/2018 | Takamine |
| 2018/0152170 A1 | 5/2018 | Iwamoto |

FOREIGN PATENT DOCUMENTS

| | | |
|---|---|---|
| JP | 2014-068123 A | 4/2014 |
| WO | 2015/080045 A1 | 6/2015 |
| WO | 2016/208447 A1 | 12/2016 |
| WO | 2017/043394 A1 | 3/2017 |

\* cited by examiner

MULTIPLEXER, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2017-154239 filed on Aug. 9, 2017 and is a Continuation Application of PCT Application No. PCT/JP2018/027358 filed on Jul. 20, 2018. The entire contents of each application are hereby incorporated herein by reference.

BACKGROUND OF THE INVENTION

1. Field of the Invention

The present invention relates to a multiplexer including two or more acoustic wave filters, and a high-frequency front end circuit and a communication device including the multiplexer.

2. Description of the Related Art

A multiplexer has been widely used in a high-frequency front end circuit of a cellular phone or a smartphone. For example, a multiplexer as a branching filter disclosed in Japanese Unexamined Patent Application Publication No. 2014-68123 has two or more band pass filters for different frequencies. Additionally, each of the band pass filters is defined by a surface acoustic wave filter chip. Each of the surface acoustic wave filter chips includes a plurality of surface acoustic wave resonators.

Japanese Unexamined Patent Application Publication No. 2010-187373 discloses an acoustic wave device formed by laminating an insulating film made of silicon dioxide and a piezoelectric substrate made of lithium tantalate on a support substrate made of silicon. Then, the support substrate and the insulating film are bonded to each other by a (111) plane of the silicon, thereby improving heat resistance.

In the multiplexer as disclosed in Japanese Unexamined Patent Application Publication No. 2014-68123, a plurality of acoustic wave filters for different frequencies are commonly connected to an antenna end side.

The inventors of preferred embodiments of the present application have discovered that, when a structure is included in which a piezoelectric body made of lithium tantalate is laminated directly or indirectly on a support substrate made of silicon, a plurality of higher-order modes appear on a higher frequency side than a main mode to be used. When such an acoustic wave resonator is used for an acoustic wave filter on a lower pass band side in a multiplexer, there is a risk that a ripple due to the higher-order mode of the acoustic wave filter will appear in a pass band of another acoustic wave filter on a higher pass band side in the multiplexer. That is, when the higher-order mode of the acoustic wave filter on the lower pass band side in the multiplexer is located within the pass band of the other acoustic wave filter on the higher pass band side, the ripple occurs in the pass band. Therefore, there is a risk that filter characteristics of the other acoustic wave filter will deteriorate.

SUMMARY OF THE INVENTION

Preferred embodiments of the present invention provide multiplexers in each of which a ripple due to a higher-order mode does not easily occur in another band pass filter, high-frequency front end circuits and communication devices including the multiplexers.

The inventors of preferred embodiments of the present application have discovered that, in an acoustic wave resonator in which a piezoelectric body made of lithium tantalate is laminated directly or indirectly on a support substrate made of silicon, first to third higher-order modes, which will be described later, appear on a higher frequency side than a main mode.

Multiplexers according to preferred embodiments of the present application each prevent at least one higher-order mode of first, second, and third higher-order modes from occurring in a pass band of another filter.

A multiplexer according to a preferred embodiment of the present invention includes N (where, N is an integer equal to or greater than 2) acoustic wave filters each including one end connected in common and having a different pass band, in which when the N acoustic wave filters are denoted as a first acoustic wave filter, a second acoustic wave filter (2), ..., an N-th acoustic wave filter in order from a side of a lower frequency of the pass band, at least one n-th acoustic wave filter ($1 \leq n < N$) among the N acoustic wave filters excluding an acoustic wave filter having the highest frequency of the pass band includes one or more acoustic wave resonators, a t-th acoustic wave resonator among the one or more acoustic wave resonators includes a support substrate having Euler angles ($\varphi_{Si}$, $\theta_{Si}$, $\psi_{Si}$) and made of silicon, a silicon nitride film laminated on the support substrate, a silicon oxide film laminated on the silicon nitride film, a piezoelectric body laminated on the silicon oxide film, having Euler angles ($\varphi_{LT}$ in a range of about 0°± about 5°, $\theta_{LT}$, $\psi_{LT}$ in a range of about 0°±about 15°), and made of lithium tantalate, and an IDT electrode provided on the piezoelectric body, when a wavelength determined by an electrode finger pitch of the IDT electrode is taken as $\lambda$ in the t-th acoustic wave resonator, a thickness normalized by the wavelength $\lambda$ is a wavelength normalized thickness, when setting values of $T_{LT}$ as a wavelength normalized thickness of the piezoelectric body, $\theta_{LT}$ as an Euler angle of the piezoelectric body, $T_S$ as a wavelength normalized thickness of the silicon oxide film, $T_N$ as a wavelength normalized thickness of the silicon nitride film, $T_E$ as a wavelength normalized thickness of the IDT electrode converted to a thickness of aluminum, obtained by a product of a value obtained by dividing a density of the IDT electrode by a density of aluminum and a wavelength normalized thickness of the IDT electrode, $\psi_{Si}$ as a propagation orientation in the support substrate, and $T_{Si}$ as a wavelength normalized thickness of the support substrate, at least one of frequencies $f_{hs\_t}^{(n)}$ of first, second, and third higher-order modes (where, s is 1, 2, or 3, a case that s is 1 indicates a frequency of the first higher-order mode, a case that s is 2 indicates a frequency of the second higher-order mode, and a case that s is 3 indicates a frequency of the third higher-order mode) determined by an expression (1) and an expression (2) indicated below determined by the $T_{LT}$, the $\theta_{LT}$, the $T_S$, the $T_N$, the $T_E$, the $\psi_{Si}$, and the $T_{Si}$, and all m acoustic wave filters ($n<m\leq N$) each having a pass band of a higher frequency than a frequency of a pass band of the n-th acoustic wave filter (n) satisfy an expression (3) or an expression (4) indicated below.

$$V_h = a_{T_{LT}}^{(3)}\left((T_{LT} + c_{T_{LT}})^3 + b_{T_{LT}}^{(3)}\right) + \\
a_{T_{LT}}^{(2)}\left((T_{LT} + c_{T_{LT}})^2 + b_{T_{LT}}^{(2)}\right) + a_{T_{LT}}^{(1)}(T_{LT} + c_{T_{LT}}) + \\
a_{T_S}^{(2)}\left((T_S + c_{T_S})^2 + b_{T_S}^{(2)}\right) + a_{T_S}^{(1)}(T_S + c_{T_S}) + \\
a_{T_N}^{(2)}\left((T_N + c_{T_N})^2 + b_{T_N}^{(2)}\right) + a_{T_N}^{(1)}(T_N + c_{T_N}) + \\
a_{T_E}^{(1)}(T_E + c_{T_E}) + a_{\psi_{Si}}^{(5)}\left((\psi_{Si} + c_{\psi_{Si}})^5 + b_{\psi_{Si}}^{(5)}\right) + \\
a_{\psi_{Si}}^{(4)}\left((\psi_{Si} + c_{\psi_{Si}})^4 + b_{\psi_{Si}}^{(4)}\right) + a_{\psi_{Si}}^{(3)}\left((\psi_{Si} + c_{\psi_{Si}})^3 + b_{\psi_{Si}}^{(3)}\right) + \\
a_{\psi_{Si}}^{(2)}\left((\psi_{Si} + c_{\psi_{Si}})^2 + b_{\psi_{Si}}^{(2)}\right) + a_{\psi_{Si}}^{(1)}(\psi_{Si} + c_{\psi_{Si}}) + e$$

Expression (1)

$$f_{hs\_t}^{(n)} = \frac{V_{hs\_t}}{\lambda_t^{(n)}}, (s = 1, 2, 3)$$

Expression (2)

$$f_{hs\_t}^{(n)} > f_u^{(m)}$$

Expression (3)

$$f_{hs\_t}^{(n)} < f_l^{(m)}$$

Expression (4)

The $f_{hs\_t}^{(n)}$ represents a frequency of a higher-order mode corresponding to the s in the t-th acoustic wave resonator included in the n-th acoustic wave filter, the $\lambda_t^{(n)}$ is a wavelength determined by the electrode finger pitch of the IDT electrode in the t-th acoustic wave resonator included in the n-th acoustic wave filter, the $f_u^{(m)}$ is a frequency of a high band side end portion of the pass band in each of the m-th acoustic wave filters, and the $f_l^{(m)}$ is a frequency of a low band side end portion of the pass band in each of the m-th acoustic wave filters.

Note that each coefficient in the expression (1) is each value shown in Table 1, Table 2, or Table 3 indicated below for each value of the s and each crystal orientation of the support substrate.

TABLE 1

| s = 1, First Higher-Order Mode | Si(100) | Si(110) | Si(111) |
|---|---|---|---|
| $a_{TLT}^{(3)}$ | 0 | 0 | 0 |
| $a_{TLT}^{(2)}$ | 0 | 0 | 0 |
| $a_{TLT}^{(1)}$ | −128.109974 | −84.392576 | −78.4352 |
| $b_{TLT}^{(3)}$ | 0 | 0 | 0 |
| $b_{TLT}^{(2)}$ | 0 | 0 | 0 |
| $c_{TLT}$ | −0.2492038 | −0.247604 | −0.24838 |
| $a_{TS}^{(2)}$ | 0 | 0 | 0 |
| $a_{TS}^{(1)}$ | −109.6889 | −182.2936559 | −485.867 |
| $b_{TS}^{(2)}$ | 0 | 0 | 0 |
| $c_{TS}$ | −0.249363 | −0.2498958 | −0.24942 |
| $a_{TN}^{(2)}$ | −337.59528 | −198.4171235 | −264.804 |
| $a_{TN}^{(1)}$ | −109.08389 | 38.137636 | −20.3216 |
| $b_{TN}^{(2)}$ | −0.0262274 | −0.04671597 | −0.04389 |
| $c_{TN}$ | −0.29617834 | 0.369166 | −0.34988 |
| $a_{TE}^{(1)}$ | 175.4682 | 13.0363945 | 0 |
| $c_{TE}$ | −0.14826 | −0.14979166 | 0 |
| $a_{\psi Si}^{(5)}$ | 0 | 0 | 0 |
| $a_{\psi Si}^{(4)}$ | 0 | 0.000489723 | 0.000503 |
| $a_{\psi Si}^{(3)}$ | 0.0236358 | −5.09E-05 | 0.006871 |
| $a_{\psi Si}^{(2)}$ | −0.0357088 | −1.017335189 | −0.80395 |
| $a_{\psi Si}^{(1)}$ | −34.8157175 | 0 | −5.57553 |
| $b_{\psi Si}^{(5)}$ | 0 | 0 | 0 |
| $b_{\psi Si}^{(4)}$ | 0 | −2150682.513 | −352545 |
| $b_{\psi Si}^{(3)}$ | 0 | −21460.18941 | 2095.948 |
| $b_{\psi Si}^{(2)}$ | −288.415605 | −970.8815104 | −470.617 |
| $c_{\psi Si}$ | −22.5 | −36.8125 | −33.3025 |
| e | 5251.687898 | 5092.365583 | 4851.236 |

TABLE 2

| s = 2, Second Higher-Order Mode | Si(100) | Si(110) | Si(111) |
|---|---|---|---|
| $a_{TLT}^{(3)}$ | 0 | 0 | 0 |
| $a_{TLT}^{(2)}$ | 2285.602094 | 3496.38329 | −2357.61 |
| $a_{TLT}^{(1)}$ | −538.88053 | −1081.86178 | −1308.55 |
| $b_{TLT}^{(3)}$ | 0 | 0 | 0 |
| $b_{TLT}^{(2)}$ | −0.0016565 | −0.001741462 | −0.00166 |
| $c_{TLT}$ | −0.251442 | −0.2501547 | −0.2497 |
| $a_{TS}^{(2)}$ | −3421.09725 | −4927.3017 | −3633.11 |
| $a_{TS}^{(1)}$ | −1054.253 | −992.33158 | −1006.69 |
| $b_{TS}^{(2)}$ | −0.0016565 | −0.2551083 | −0.00166 |
| $c_{TS}$ | −0.2514423 | 0.2551 | −0.25019 |
| $a_{TN}^{(2)}$ | 1042.56084 | −423.87007 | −135.325 |
| $a_{TN}^{(1)}$ | 159.11219 | 80.7948 | −106.73 |
| $b_{TN}^{(2)}$ | −0.02613905 | −0.05219411 | −0.0486 |
| $c_{TN}$ | −0.2961538 | −0.36996 | −0.39884 |
| $a_{TN}^{(1)}$ | −171.153846 | −637.391944 | −585.696 |
| $c_{TE}$ | 0.15 | −0.151236 | −0.14932 |
| $a_{\psi Si}^{(5)}$ | 0 | 0 | 0 |
| $a_{\psi Si}^{(4)}$ | 0 | −0.00098215 | −0.00016 |

TABLE 2-continued

| s = 2, Second Higher-Order Mode | Si(100) | Si(110) | Si(111) |
|---|---|---|---|
| $a_{\psi Si}^{(3)}$ | −0.0038938 | −0.002109232 | −0.00037 |
| $a_{\psi Si}^{(2)}$ | −0.00306409 | 2.25463 | 0.224668 |
| $a_{\psi Si}^{(1)}$ | 2.8538478 | 23.6872514 | 1.243381 |
| $b_{\psi Si}^{(5)}$ | 0 | 0 | 0 |
| $b_{\psi Si}^{(4)}$ | 0 | −2959279.229 | −399785 |
| $b_{\psi Si}^{(3)}$ | 234.60436 | −21928.45828 | 5.712562 |
| $b_{\psi Si}^{(2)}$ | −289.82063 | −1407.041187 | −535.077 |
| $c_{\psi Si}$ | 22.78846 | −39.1640886 | −29.9806 |
| e | 5282.98076 | 5338.606811 | 5411.395 |

TABLE 3

| s = 3, Third Higher-Order Mode | Si(100) | Si(110) | Si(111) |
|---|---|---|---|
| $a_{TLT}^{(3)}$ | 0 | 0 | 0 |
| $a_{TLT}^{(2)}$ | 0 | 0 | 3595.754 |
| $a_{TLT}^{(1)}$ | −782.3425 | −1001.237815 | −592.246 |
| $b_{TLT}^{(3)}$ | 0 | 0 | 0 |
| $b_{TLT}^{(2)}$ | 0 | 0 | −0.00164 |
| $c_{TLT}$ | −0.254819 | −0.2578947 | −0.25367 |
| $a_{TS}^{(2)}$ | −14897.59116 | 0 | 0 |
| $a_{TS}^{(1)}$ | −599.8312 | −686.9212563 | −438.155 |
| $b_{TS}^{(2)}$ | −0.00162005 | 0 | 0 |
| $c_{TS}$ | −0.25682 | −0.25546558 | −0.25562 |
| $a_{TN}^{(2)}$ | 0 | 0 | 0 |
| $a_{TN}^{(1)}$ | 0 | 125.557557 | 15.72663 |
| $b_{TN}^{(2)}$ | 0 | 0 | 0 |
| $c_{TN}$ | 0 | −0.349392713 | −0.40872 |
| $a_{TE}^{(1)}$ | −154.8823 | −764.8758717 | −290.54 |
| $c_{TE}$ | −0.14819277 | −0.15303643 | −0.15149 |
| $a_{\psi Si}^{(5)}$ | 0 | 0 | 0 |
| $a_{\psi Si}^{(4)}$ | 0 | 0 | −0.00073 |
| $a_{\psi Si}^{(3)}$ | 0.010467682 | −0.000286554 | −0.00318 |
| $a_{\psi Si}^{(2)}$ | −0.196913569 | 0.67197739 | 0.969126 |
| $a_{\psi Si}^{(1)}$ | 0.3019959 | 0.197549 | 0.359421 |
| $b_{\psi Si}^{(5)}$ | 0 | 0 | 0 |
| $b_{\psi Si}^{(4)}$ | 0 | −0.000204665 | 0 |
| $b_{\psi Si}^{(3)}$ | 0 | −14837.92017 | 670.2052 |
| $b_{\psi Si}^{(2)}$ | −240.3687037 | −1590.306348 | −525.572 |
| $c_{\psi Si}$ | 24.4578313 | −41.9028 | −31.1239 |
| e | 5730.906036 | 5574.008097 | 5675.837 |

A multiplexer according to a preferred embodiment of the present invention includes N (where, N is an integer equal to or greater than 2) acoustic wave filters each including one end connected in common and having a different pass band, in which when the N acoustic wave filters are denoted as a first acoustic wave filter, a second acoustic wave filter, . . . , an N-th acoustic wave filter in order from a side of a lower frequency of the pass band, at least one n-th acoustic wave filter (1≤n<N) among the N acoustic wave filters excluding an acoustic wave filter having the highest frequency of the pass band includes one or more acoustic wave resonators, a t-th acoustic wave resonator among the one or more acoustic wave resonators includes a support substrate having Euler angles ($\varphi_{Si}$, $\theta_{Si}$, $\psi_{Si}$) and made of silicon, a silicon nitride film laminated on the support substrate, a silicon oxide film laminated on the silicon nitride film, a piezoelectric body laminated on the silicon oxide film, having Euler angles ($\varphi_{LT}$ in a range of about 0°±about 5°, $\theta_{LT}$, $\psi_{LT}$ in a range of about 0° t about 15°), and made of lithium tantalate, and an IDT electrode provided on the piezoelectric body, when a wavelength determined by an electrode finger pitch of the IDT electrode is λ in the t-th acoustic wave resonator, a thickness normalized by the wavelength λ is a wavelength normalized thickness, when setting values of $T_{LT}$ as a wavelength normalized thickness of the piezoelectric body, $\theta_{LT}$ as an Euler angle of the piezoelectric body, $T_S$ as a wavelength normalized thickness of the silicon oxide film, $T_N$ as a wavelength normalized thickness of the silicon nitride film, $T_E$ as a wavelength normalized thickness of the IDT electrode converted to a thickness of aluminum, obtained by a product of a value obtained by dividing a density of the IDT electrode by a density of aluminum and a wavelength normalized thickness of the IDT electrode, $\psi_{Si}$ as a propagation orientation in the support substrate, and $T_{Si}$ as a wavelength normalized thickness of the support substrate, at least one of frequencies $f_{hs\_t}^{(n)}$ of first, second, and third higher-order modes (where, s is 1, 2, or 3, a case that s is 1 indicates a frequency of the first higher-order mode, a case that s is 2 indicates a frequency of the second higher-order mode, and a case that s is 3 indicates a frequency of the third higher-order mode) determined by an expression (5) and an expression (2) indicated below determined by the $T_{LT}$, the $\theta_{LT}$, the $T_S$, the $T_N$, the $T_E$, the $\psi_{Si}$, and the $T_{Si}$, and all m-th acoustic wave filters (n<m≤N) each having a pass band of a higher frequency than a frequency of a pass band of the acoustic wave filter (n) satisfy an expression (3) or an expression (4) indicated below.

$$V_h = a_{T_{LT}}^{(2)}\left((T_{LT} - c_{T_{LT}})^2 - b_{T_{LT}}^{(2)}\right) + a_{T_{LT}}^{(1)}(T_{LT} - c_{T_{LT}}) +$$
$$a_S^{(2)}\left((T_S - c_{T_S})^2 - b_{T_S}^{(2)}\right) + a_{T_S}^{(1)}(T_S - c_{T_S}) +$$
$$a_{T_N}^{(3)}\left((T_N - c_{T_N})^3 - b_{T_N}^{(3)}\right) + a_{T_N}^{(2)}\left((T_N - c_{T_N})^2 - b_{T_N}^{(2)}\right) +$$
$$a_{T_N}^{(1)}(T_N - c_{T_N}) + a_{T_E}^{(1)}(T_E - c_{T_E}) +$$
$$a_{\psi_{Si}}^{(4)}\left((\psi_{Si} - c_{\psi_{Si}})^4 - b_{\psi_{Si}}^{(4)}\right) + a_{\psi_{Si}}^{(3)}\left((\psi_{Si} - c_{\psi_{Si}})^3 - b_{\psi_{Si}}^{(3)}\right) +$$
$$a_{\psi_{Si}}^{(2)}\left((\psi_{Si} - c_{\psi_{Si}})^2 - b_{\psi_{Si}}^{(2)}\right) + a_{\psi_{Si}}^{(1)}(\psi_{Si} - c_{\psi_{Si}}) +$$
$$a_{\theta_{LT}}^{(1)}(\theta_{LT} - c_{\theta_{LT}}) + d_{T_{LT}T_S}(T_{LT} - c_{T_{LT}})(T_S - c_{T_S}) +$$
$$d_{T_{LT}T_N}(T_{LT} - c_{T_{LT}})(T_N - c_{T_N}) +$$
$$d_{T_{LT}\psi_{Si}}(T_{LT} - c_{T_{LT}})(\psi_{Si} - c_{\psi_{Si}}) +$$
$$d_{T_S T_N}(T_S - c_{T_S})(T_N - c_{T_N}) +$$
$$d_{T_N\psi_{Si}}(T_N - c_{T_N})(\psi_{Si} - c_{\psi_{Si}}) +$$
$$d_{T_N\theta_{LT}}(T_N - c_{T_N})(\theta_{LT} - c_{\theta_{LT}}) +$$
$$d_{T_E\psi_{Si}}(T_E - c_{T_E})(\psi_{Si} - c_{\psi_{Si}}) +$$
$$d_{\psi_{Si}\theta_{LT}}(\psi_{Si} - c_{\psi_{Si}})(\theta_{LT} - c_{\theta_{LT}}) + e$$

Expression (5)

$$f_{h_{s\_t}}^{(n)} = \frac{V_{h_{s\_t}}}{\lambda_t^{(n)}}, (s = 1, 2, 3)$$

Expression (2)

$$f_{h_{s\_t}}^{(n)} > f_u^{(m)}$$

Expression (3)

$$f_{h_{s\_t}}^{(n)} < f_l^{(m)}$$

Expression (3)

The $f_{h_{s\_t}}^{(n)}$ represents a frequency of a higher-order mode corresponding to the s in the t-th acoustic wave resonator included in the n-th acoustic wave filter, the $\lambda_t^{(n)}$ is a wavelength determined by the electrode finger pitch of the IDT electrode in the t-th acoustic wave resonator included in the n-th acoustic wave filter, the $f_u^{(m)}$ is a frequency of a high band side end portion of the pass band in each of the m-th acoustic wave filters, the $f_l^{(m)}$ is a frequency of a low band side end portion of the pass band in each of the m-th acoustic wave filters, and each coefficient in the expression (5) is each value shown in Table 4, Table 5, or Table 6 indicated below for each value of the s and each crystal orientation of the support substrate.

TABLE 4

| s = 1, First Higher-Order Mode | Si(100) | Si(110) | Si(111) |
|---|---|---|---|
| $a_{TLT}^{(2)}$ | 0 | 0 | 0 |
| $a_{TLT}^{(1)}$ | 0 | 0 | 0 |
| $b_{TLT}^{(2)}$ | 0 | 0 | 0 |
| $c_{TLT}$ | 0 | 0 | 0 |
| $a_{TS}^{(2)}$ | 0 | 0 | 0 |
| $a_{TS}^{(1)}$ | 0 | 0 | 534.5188318 |
| $b_{TS}^{(2)}$ | 0 | 0 | 0 |
| $c_{TS}$ | 0 | 0 | 0.249010293 |
| $a_{TN}^{(3)}$ | 0 | 0 | 0 |
| $a_{TN}^{(2)}$ | 0 | 0 | 0 |
| $a_{TN}^{(1)}$ | 0 | 0 | −36.51741324 |
| $b_{TN}^{(3)}$ | 0 | 0 | 0 |
| $b_{TN}^{(2)}$ | 0 | 0 | 0 |
| $c_{TN}$ | 0 | 0 | 0.35114806 |
| $a_{TE}^{(1)}$ | 0 | 0 | 0 |
| $c_{TE}$ | 0 | 0 | 0 |
| $a_{\psi Si}^{(4)}$ | 0 | 0 | 0.000484609 |
| $a_{\psi Si}^{(3)}$ | 0.022075968 | 0 | 0.005818261 |
| $a_{\psi Si}^{(2)}$ | −0.18782287 | 0.081701713 | −0.805302371 |
| $a_{\psi Si}^{(1)}$ | −33.85785847 | 10.57201342 | −4.785681077 |
| $b_{\psi Si}^{(4)}$ | 0 | 0 | 351437.8188 |
| $b_{\psi Si}^{(3)}$ | 806.2400011 | 0 | −1862.605341 |
| $b_{\psi Si}^{(2)}$ | 270.2635345 | 986.4812738 | 471.945355 |

TABLE 4-continued

| s = 1, First Higher-Order Mode | Si(100) | Si(110) | Si(111) |
|---|---|---|---|
| $c_{\psi Si}$ | 20.26171875 | 37.73795535 | 32.87410926 |
| $a_{\theta LT}^{(1)}$ | 0 | 0 | 0 |
| $c_{\theta LT}$ | 0 | 0 | 0 |
| $d_{TLTTS}$ | 0 | 0 | 0 |
| $d_{TLTTN}$ | 0 | 0 | 0 |
| $d_{TLT\psi Si}$ | 0 | 0 | 0 |
| $d_{TSTN}$ | 0 | 0 | 1862.994192 |
| $d_{TN\psi Si}$ | 0 | 0 | 0 |
| $d_{TN\theta LT}$ | 0 | 0 | 0 |
| $d_{TE\psi Si}$ | 0 | 0 | 0 |
| $d_{\psi Si\theta LT}$ | 0 | 0 | 0 |
| e | 5317.859375 | 5103.813161 | 4853.204861 |

TABLE 5

| s = 2, Second Higher-Order Mode | Si(100) | Si(110) | Si(111) |
|---|---|---|---|
| $a_{TLT}^{(2)}$ | 0 | 0 | 0 |
| $a_{TLT}^{(1)}$ | −608.2898721 | −1003.471473 | −1270.018362 |
| $b_{TLT}^{(2)}$ | 0 | 0 | 0 |
| $c_{TLT}$ | 0.25 | 0.253954306 | 0.249121666 |
| $a_{TS}^{(2)}$ | 0 | 0 | 0 |
| $a_{TS}^{(1)}$ | −1140.654415 | −1030.75867 | −1039.830158 |
| $b_{TS}^{(2)}$ | 0 | 0 | 0 |
| $c_{TS}$ | 0.249966079 | 0.255272408 | 0.250032531 |
| $a_{TN}^{(3)}$ | −3219.596725 | 0 | 2822.963403 |
| $a_{TN}^{(2)}$ | 555.8662451 | 0 | −264.9680504 |
| $a_{TN}^{(1)}$ | 465.8636149 | 53.04201209 | −288.9461645 |
| $b_{TN}^{(3)}$ | 0.001081155 | 0 | 0.000392787 |
| $b_{TN}^{(2)}$ | 0.04654949 | 0 | 0.48934743 |
| $c_{TN}$ | 0.378426052 | 0.376449912 | 0.392908263 |
| $a_{TE}^{(1)}$ | 0 | −622.7635558 | −614.5885324 |
| $c_{TE}$ | 0 | 0.151274165 | 0.15815224 |
| $a_{\psi Si}^{(4)}$ | 0 | −0.00096736 | −0.000227305 |
| $a_{\psi Si}^{(3)}$ | 0 | −0.006772454 | −0.000220017 |
| $a_{\psi Si}^{(2)}$ | 0 | 2.203099663 | 0.31727324 |
| $a_{\psi Si}^{(1)}$ | 0.833288758 | 28.15768206 | 0.648998523 |
| $b_{\psi Si}^{(4)}$ | 0 | 2959964.533 | 396965.3474 |
| $b_{\psi Si}^{(3)}$ | 0 | 19143.61126 | 87.44425969 |
| $b_{\psi Si}^{(2)}$ | 0 | 1447.367657 | 532.0008856 |
| $c_{\psi Si}$ | 22.51017639 | 40.50966608 | 29.90240729 |
| $a_{\theta LT}^{(1)}$ | −1.501270796 | −2.076046604 | −2.376979261 |
| $c_{\theta LT}$ | −52.08683853 | −50.82249561 | −49.04879636 |
| $d_{TLTTS}$ | 0 | 0 | 0 |
| $d_{TLTTN}$ | 0 | 0 | 0 |
| $d_{TLT\psi Si}$ | 0 | 16.61849238 | 0 |
| $d_{TSTN}$ | 0 | 1820.795615 | 1482.11565 |
| $d_{TN\psi Si}$ | 0 | 3.625908485 | −3.131543418 |
| $d_{TN\theta LT}$ | 0 | 0 | 1607.412093 |
| $d_{TE\psi Si}$ | 0 | 0 | 0 |
| $d_{\psi Si\theta LT}$ | 0 | 0 | 0.089566113 |
| e | 5326.187246 | 5356.110093 | 5418.323508 |

TABLE 6

| s = 3, Third Higher-Order Mode | Si(100) | Si(110) | Si(111) |
|---|---|---|---|
| $a_{TLT}^{(2)}$ | −14710.45271 | 0 | 0 |
| $a_{TLT}^{(1)}$ | −764.4056124 | −942.2882121 | −582.1313356 |
| $b_{TLT}^{(2)}$ | 0.001558682 | 0 | 0 |
| $c_{TLT}$ | 0.257243963 | 0.255649419 | 0.251712062 |

TABLE 6-continued

| s = 3, Third Higher-Order Mode | Si(100) | Si(110) | Si(111) |
|---|---|---|---|
| $a_{TS}^{(2)}$ | −21048.18754 | 0 | 0 |
| $a_{TS}^{(1)}$ | −508.6730943 | −705.5211128 | −400.0368899 |
| $b_{TS}^{(2)}$ | 0.001583662 | 0 | 0 |
| $c_{TS}$ | 0.257243963 | 0.254751848 | 0.254357977 |
| $a_{TN}^{(3)}$ | 0 | 0 | 0 |
| $a_{TN}^{(2)}$ | 0 | 0 | 0 |
| $a_{TN}^{(1)}$ | 0 | 97.59462013 | 24.94240828 |
| $b_{TN}^{(3)}$ | 0 | 0 | 0 |
| $b_{TN}^{(2)}$ | 0 | 0 | 0 |
| $c_{TN}$ | 0 | 0.367793031 | 0.404280156 |
| $a_{TE}^{(1)}$ | −276.7311066 | −747.0884117 | 0 |
| $c_{TE}$ | 0.1494796 | 0.152164731 | 0 |
| $a_{\psi Si}^{(4)}$ | 0 | 0 | −0.00075146 |
| $a_{\psi Si}^{(3)}$ | 0.011363183 | 0.003532214 | −0.002666357 |
| $a_{\psi Si}^{(2)}$ | −0.23320473 | 0.218669312 | 1.006728665 |
| $a_{\psi Si}^{(1)}$ | 0.214067146 | −11.24365221 | 0.523191515 |
| $b_{\psi Si}^{(4)}$ | 0 | 0 | 381500.5075 |
| $b_{\psi Si}^{(3)}$ | 180.0564368 | 20914.04622 | −493.6094588 |
| $b_{\psi Si}^{(2)}$ | 257.0498426 | 1548.182277 | 530.6814032 |
| $c_{\psi Si}$ | 22.31890092 | 39.72544879 | 30.82490272 |
| $a_{\theta LT}^{(1)}$ | 0 | 0 | −1.551626054 |
| $c_{\theta LT}$ | 0 | 0 | −49.16731518 |
| $d_{TLTTS}$ | −13796.64706 | 0 | 1575.283126 |
| $d_{TLTTN}$ | 0 | 0 | 0 |
| $d_{TLT\psi Si}$ | 30.35701585 | 0 | 0 |
| $d_{TSTN}$ | 0 | 0 | 0 |
| $d_{TN\psi Si}$ | 0 | 0 | 0 |
| $d_{TN\theta LT}$ | 0 | 0 | 0 |
| $d_{TE\psi Si}$ | 28.27908094 | 0 | 0 |
| $d_{\psi Si\theta LT}$ | 0 | 0 | −0.086544362 |
| e | 5700.075407 | 5563.854277 | 5688.418884 |

In a multiplexer according to a preferred embodiment of the present invention, the values of the $T_{LT}$, the $\theta_{LT}$, the $T_S$, the $T_N$, the $T_E$, the $\psi_{Si}$, and the $T_{Si}$, are selected such that the frequencies $f_{hs\_t}^{(n)}$ of the first and second higher-order modes satisfy the expression (3) or the expression (4).

In a multiplexer according to a preferred embodiment of the present invention, the values of the $T_{LT}$, the $\theta_{LT}$, the $T_S$, the $T_N$, the $T_E$, the $\psi_{Si}$, and the $T_{Si}$, are selected such that the frequencies $f_{hs\_t}^{(n)}$ of the first and third higher-order modes satisfy the expression (3) or the expression (4).

In a multiplexer according to a preferred embodiment of the present invention, the values of the $T_{LT}$, the $\theta_{LT}$, the $T_S$, the $T_N$, the $T_E$, the $\psi_{Si}$, and the $T_{Si}$, are selected such that the frequencies $f_{hs\_t}^{(n)}$ of the second and third higher-order modes satisfy the expression (3) or the expression (4).

In a multiplexer according to a preferred embodiment of the present invention, the values of the $T_{LT}$, the $\theta_{LT}$, the $T_S$, the $T_N$, the $T_E$, the $\psi_{Si}$, and the $T_{Si}$, are selected such that all the frequencies $f_{hs\_t}^{(n)}$ of the first, second, and third higher-order modes satisfy the expression (3) or the expression (4). In this case, ripples caused by respective responses by the first higher-order mode, the second higher-order mode, and the third higher-order mode do not appear in the pass band of the other acoustic wave filter.

In a multiplexer according to a preferred embodiment of the present invention, the wavelength normalized thickness $T_{Si}$ of the support substrate satisfies $T_{Si}$>about 4.

In a multiplexer according to a preferred embodiment of the present invention, $T_{Si}$>about 10 is satisfied.

In a multiplexer according to a preferred embodiment of the present invention, $T_{Si}$>about 20 is satisfied.

In a multiplexer according to a preferred embodiment of the present invention, the wavelength normalized thickness of the piezoelectric body is equal to or less than about 3.5λ.

In a multiplexer according to a preferred embodiment of the present invention, the wavelength normalized thickness of the piezoelectric body is equal to or less than about 2.5λ.

In a multiplexer according to a preferred embodiment of the present invention, the wavelength normalized thickness of the piezoelectric body is equal to or less than about 1.5λ.

In a multiplexer according to a preferred embodiment of the present invention, the wavelength normalized thickness of the piezoelectric body is equal to or less than about 0.5λ.

In a multiplexer according to a preferred embodiment of the present invention, an antenna terminal to which one ends of the plurality of acoustic wave filters are connected in common is further included, and the acoustic wave resonator satisfying the expression (3) or the expression (4) is an acoustic wave resonator which is closest to the antenna terminal. In this case, ripples caused by the first, second, and third higher-order modes are more unlikely to occur in a pass band of the other acoustic wave filter.

In a multiplexer according to a preferred embodiment of the present invention, all of the one or more acoustic wave resonators are each the acoustic wave resonator satisfying the expression (3) or the expression (4). In this case, the ripple caused by at least one higher-order mode among the first, second, and third higher-order modes in the other acoustic wave filter is able to be more effectively reduced or prevented.

A multiplexer according to a preferred embodiment of the present invention may also be a duplexer.

Furthermore, a multiplexer according to a preferred embodiment of the present invention may further include an antenna terminal to which one ends of the plurality of acoustic wave filters are connected in common, and may be a composite filter in which three or more acoustic wave filters are connected in common on a side of the antenna terminal.

In a multiplexer according to a preferred embodiment of the present invention, the multiplexer is a composite filter device for carrier aggregation (CA).

Preferably, the acoustic wave filter including the one or more acoustic wave resonators in a multiplexer according to a preferred embodiment of the present invention is a ladder filter including a plurality of serial arm resonators and a plurality of parallel arm resonators. In this case, the influence of the higher-order mode is able to be more effectively reduced or prevented.

A high-frequency front end circuit according to a preferred embodiment of the present invention includes a multiplexer according to a preferred embodiment of the present invention, and a power amplifier.

A communication device according to a preferred embodiment of the present invention includes a high-frequency front end circuit including a multiplexer according to a preferred embodiment of the present invention and a power amplifier, and an RF signal processing circuit.

According to preferred embodiments of the present invention, at least one higher-order mode among a plurality of higher-order modes generated by at least one acoustic wave resonator of an acoustic wave filter on a lower pass band side does not easily occur within a pass band of another acoustic wave filter on a higher pass band side. Accordingly, deterioration in filter characteristics of the other acoustic wave filter does not easily occur. Therefore, it is possible to provide high-frequency front end circuits and communication devices each including a multiplexer having excellent filter characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through description of specific preferred embodiments of the present invention with reference to the drawings.

Each of the preferred embodiments described in the present specification is exemplary and a partial replacement or combination of configurations is also possible among different preferred embodiments.

First Preferred Embodiment

Figure 1:
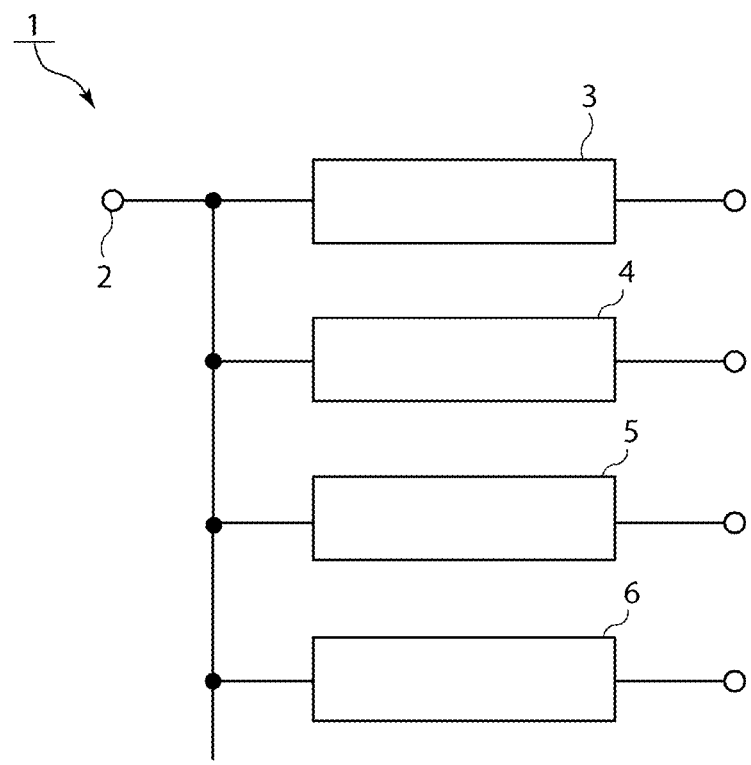
FIG. 1 is a circuit diagram of a multiplexer according to a first preferred embodiment of the present invention.

FIG. 1 is a circuit diagram of a multiplexer according to a first preferred embodiment of the present invention. A multiplexer 1 includes an antenna terminal 2. The antenna terminal 2 is, for example, a terminal connected to an antenna of a smartphone.

In the multiplexer 1, first to fourth acoustic wave filters 3 to 6 are connected in common to the antenna terminal 2. Each of the first to fourth acoustic wave filters 3 to 6 is a band pass filter.

Figure 4:
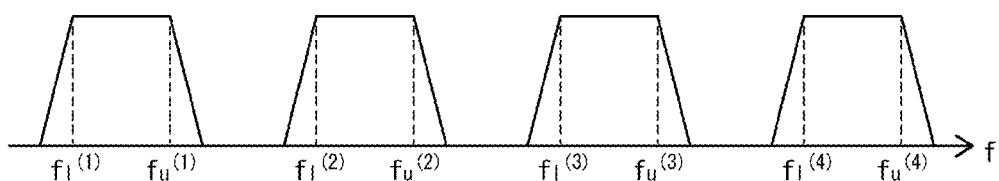
FIG. 4 is a schematic diagram illustrating pass bands of first to fourth acoustic wave filters according to the first preferred embodiment of the present invention.

FIG. 4 is a schematic diagram illustrating pass bands of the first to fourth acoustic wave filters 3 to 6. As illustrated in FIG. 4, the pass bands of the first to fourth acoustic wave filters are different. The pass bands of the first to fourth acoustic wave filters are referred to as first to fourth pass bands, respectively.

For frequency positions, the first pass band<the second pass band<the third pass band<the fourth pass band is satisfied. In the second to fourth pass bands, a low band side end portion is denoted by $f_l^{(m)}$, and a high band side end portion is denoted by $f_u^{(m)}$. Note that the low band side end portion is a low band side end portion of the pass band. Additionally, the high band side end portion is a high band side end portion of the pass band. As the low band side end portion and the high band side end portion of the pass band, for example, an end portion of a frequency band of each band standardized by 3GPP or the like may preferably be used. Note that the multiplexer 1 according to the present preferred embodiment can be used as, for example, a composite filter device for carrier aggregation.

Here, (m) is 2, 3, or 4 according to the second to fourth pass bands.

Figure 2:
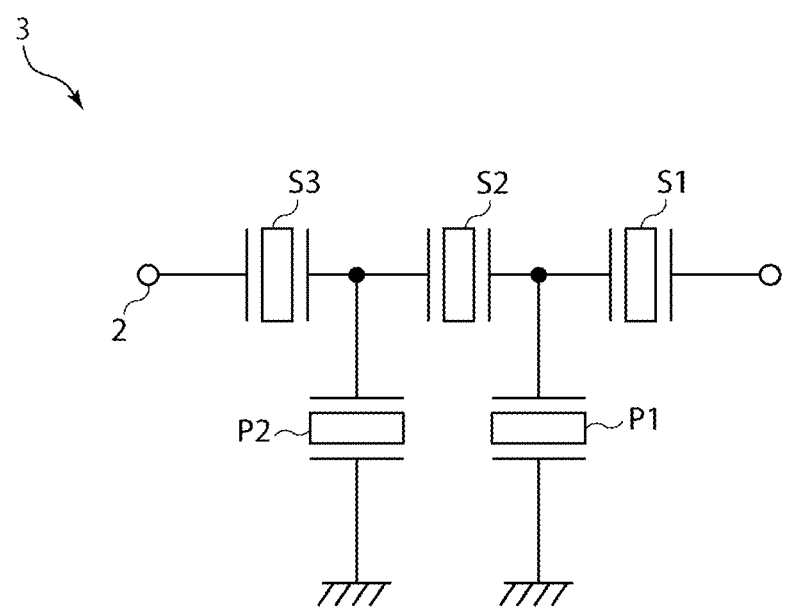
FIG. 2 is a circuit diagram illustrating a first acoustic wave filter used in the multiplexer according to the first preferred embodiment of the present invention.

The first to fourth acoustic wave filters 3 to 6 each include a plurality of acoustic wave resonators. FIG. 2 is a circuit diagram of the first acoustic wave filter 3. The first acoustic wave filter 3 includes serial arm resonators S1 to S3 and parallel arm resonators P1 and P2 each of which is configured of an acoustic wave resonator. That is, the first acoustic wave filter 3 is preferably a ladder filter. However, the number of serial arm resonators and the number of parallel arm resonators in the ladder filter are not limited to this.

Additionally, the second to fourth acoustic wave filters 4 to 6 are similarly configured as ladder filters in the present preferred embodiment, and include a plurality of serial arm resonators and a plurality of parallel arm resonators.

Note that the first to fourth acoustic wave filters 3 to 6 may have a circuit configuration other than the ladder filter as long as a plurality of acoustic wave resonators are included. For example, an acoustic wave filter in which an acoustic wave resonator is connected in series to a longitudinally coupled resonator acoustic wave filter may also be used. Furthermore, an acoustic wave filter in which a ladder filter is connected to a longitudinally coupled resonator acoustic wave filter may also be used. It is sufficient that the first acoustic wave filter 3 includes one or more acoustic wave resonators.

Figure 3A:
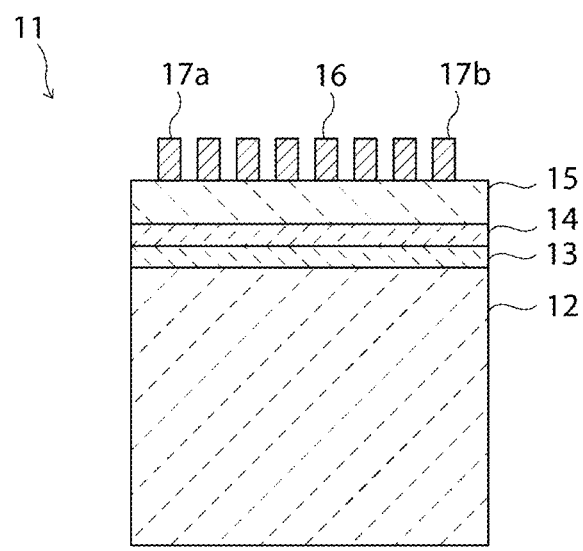
FIG. 3A is a schematic elevational cross-sectional view of an acoustic wave resonator used in the multiplexer according to the first preferred embodiment of the present invention.
Figure 3B:
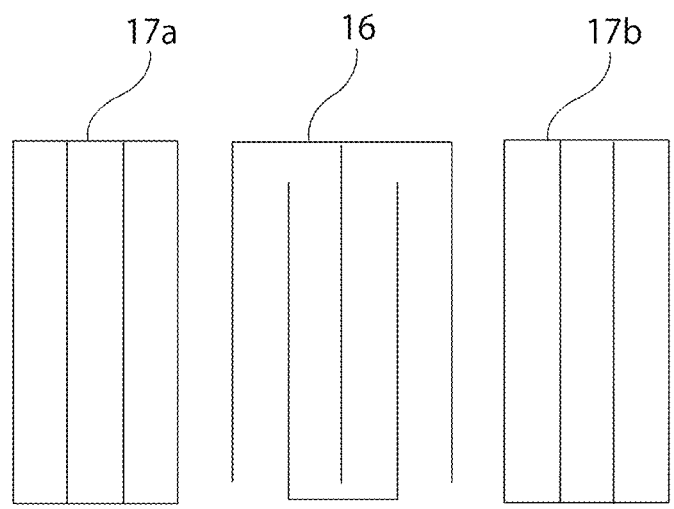
FIG. 3B is a schematic plan view illustrating an electrode structure of the acoustic wave resonator.

FIG. 3A is a schematic elevational cross-sectional view of an acoustic wave resonator of the serial arm resonators S1 to S3 or the parallel arm resonators P1 and P2 of the first acoustic wave filter 3, and FIG. 3B is a schematic plan view illustrating an electrode structure thereof.

An acoustic wave resonator 11 includes a support substrate 12, a silicon nitride film 13 laminated on the support substrate 12, a silicon oxide film 14, and a piezoelectric body 15 laminated on the silicon oxide film 14. That is, the silicon oxide film 14 is laminated between the silicon nitride film 13 and the piezoelectric body 15. Note that when the support substrate 12, the silicon nitride film 13, the silicon oxide film 14, and the piezoelectric body 15 are used as respective layers of the acoustic wave resonator 11, another layer may be laminated between the respective layers. The silicon oxide film 14 may include a plurality of layers, and may have a multilayer structure including an intermediate layer made of titanium, nickel, or the like, for example, between the plurality of layers. That is, a multilayer structure in which a first silicon oxide film, an intermediate layer, and a second silicon oxide film are laminated in this order from the support substrate 12 side may be used. A wavelength normalized thickness of the silicon oxide film 14 in this case indicates a thickness of the multilayer structure as a whole. In the same or similar manner, the silicon nitride film 13 may include a plurality of layers, and may have a multilayer structure including an intermediate layer made of titanium, nickel, or the like, for example, between the plurality of layers. That is, a multilayer structure in which a first silicon nitride film, an intermediate layer, and a second silicon nitride film 13 are laminated in this order from the support substrate 12 side may be used. A wavelength normalized thickness of the silicon nitride film 13 in this case indicates a thickness of the multilayer structure as a whole.

The support substrate 12 is made of silicon. The support substrate 12 is preferably made of single crystal silicon, for example, but does not have to be made of a complete single crystal, and it is sufficient that a crystal orientation is included. The silicon nitride film 13 is preferably an SiN film, for example. However, the SiN may be doped with other elements. The silicon oxide film 14 is preferably an $SiO_2$ film, for example. As long as the silicon oxide film 14 is made of silicon oxide, for example, a material obtained by doping $SiO_2$ with fluorine or the like may be included. The piezoelectric body 15 is made of lithium tantalate. The piezoelectric body 15 is preferably made of single crystal lithium tantalate, for example, but does not have to be made of a complete single crystal, and it is sufficient that a crystal orientation is included. In addition, as long as the piezoelectric body 15 is made of lithium tantalate, a material other than $LiTaO_3$ may be used. The lithium tantalate may be doped with Fe or the like.

Note that a thickness of the silicon oxide film 14 may be 0. In other words, the silicon oxide film 14 may not be provided.

An IDT (Interdigital Transducer) electrode 16 is provided on an upper surface of the piezoelectric body 15. More specifically, reflectors 17a and 17b are provided on both sides in an acoustic wave propagation direction of the IDT electrode 16, thus defining a single-port surface acoustic wave resonator. In the present preferred embodiment, the IDT electrode 16 is directly provided on the piezoelectric body 15, but the IDT electrode 16 may be indirectly provided on the piezoelectric body 15.

The inventors of preferred embodiments of the present application have discovered that, in the acoustic wave filter device in which the piezoelectric body 15 made of lithium tantalate is laminated directly or indirectly on the support substrate 12, when an acoustic wave is excited, responses of a plurality of higher-order modes appear on a higher frequency side than a main mode, other than a response of a main mode to be used. The plurality of higher-order modes will be described with reference to FIG. 5.

Figure 5:
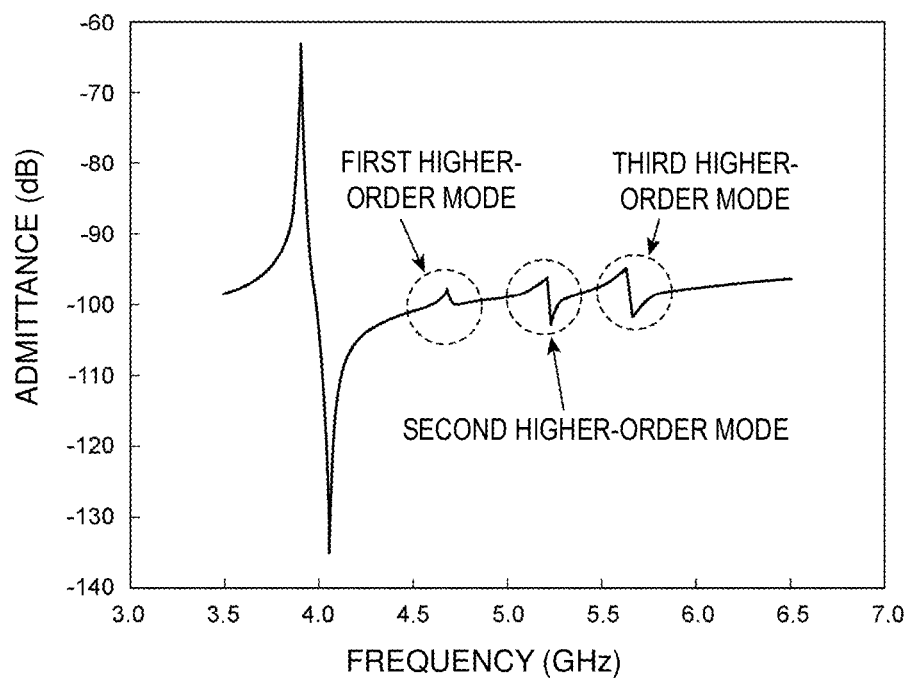
FIG. 5 is a diagram illustrating admittance characteristics of an acoustic wave resonator.

FIG. 5 is a diagram illustrating admittance characteristics of an example of an acoustic wave resonator in which a silicon nitride film, a silicon oxide film, and a piezoelectric body are laminated on a support substrate. As is apparent from FIG. 5, responses of first to third higher-order modes appear at frequency positions higher than a response of a main mode appearing near 3.9 GHz. The response of the first higher-order mode appears near 4.7 GHz, as indicated by the arrow. The response of the second higher-order mode appears near 5.2 GHz. The response of the third higher-order mode appears near 5.7 GHz. That is, when the frequency of the response of the first higher-order mode is denoted as f1, the frequency of the response of the second higher-order mode is denoted as f2, and the frequency of the response of the third higher-order mode is denoted as f3, f1<f2<f3 is established. Note that the frequency of the response of the higher-order mode is a peak position of impedance phase characteristics of the higher-order mode.

As described above, in the multiplexer in which the plurality of acoustic wave filters for different frequencies are commonly connected on the antenna terminal side, when the higher-order mode by the acoustic wave filter on the lower pass band side appears in the pass band of another acoustic wave filter on the higher pass band side in the multiplexer, a ripple is caused. Therefore, it is preferable that at least one higher-order mode among the first higher-order mode, the second higher-order mode, and the third higher-order mode does not appear in the pass bands of the second to fourth acoustic wave filters 4 to 6. Preferably, two higher-order modes among the first higher-order mode, the second higher-order mode, and the third higher-order mode do not appear in the pass bands of the second to fourth acoustic wave filters 4 to 6. For example, it is preferable that the responses of the first higher-order mode and the second higher-order mode, the responses of the first higher-order mode and the third higher-order mode, or the responses of the second higher-order mode and the third higher-order mode do not appear in the pass bands of the second to fourth acoustic wave filters 4 to 6. More preferably, all of the first higher-order mode, the second higher-order mode, and the third higher-order mode do not appear in the pass bands of the second to fourth acoustic wave filters 4 to 6. However, FIG. 5 is an example, and a positional relationship between the frequencies of the respective higher-order modes may be switched depending on conditions, such as the wavelength normalized thickness of the IDT electrode or the like, for example.

A feature of the multiplexer 1 according to the present preferred embodiment is that in at least one acoustic wave resonator of the first acoustic wave filter 3, the response of the first higher-order mode does not appear in the second to fourth pass bands illustrated in FIG. 4. Therefore, the filter characteristics of the second to fourth acoustic wave filters 4 to 6 do not easily deteriorate.

The features of the present preferred embodiment are described in the following i) and ii).

i) Values of a wavelength normalized thickness $T_{LT}$ of the piezoelectric body 15 made of lithium tantalate, an Euler angle $\theta_{LT}$ of the piezoelectric body 15 made of lithium tantalate, a wavelength normalized thickness $T_S$ of the silicon oxide film 14, a wavelength normalized thickness $T_N$ of the silicon nitride film 13, a wavelength normalized thickness $T_E$ of the IDT electrode 16 converted to a thickness of aluminum, a propagation orientation $\psi_{Si}$ of the support substrate 12 made of silicon, and a wavelength normalized thickness $T_{Si}$ of the support substrate 12 are set to values such that a frequency $f_{h1\_r}(n)$ of the first higher-order mode determined by the following expression (1) and expression (2) satisfies the following expression (3) or expression (4) for all m which satisfy m>n, and ii) $T_{Si}$>about 20 is satisfied. Note that when the IDT electrode is defined by a laminated metal film, the wavelength normalized thickness $T_E$ is a wavelength normalized thickness converted to the thickness of the IDT electrode made of aluminum, from a thickness and density of each electrode layer of the IDT electrode.

With this, the response by the first higher-order mode is located outside the pass band of the second to fourth acoustic wave filters 4 to 6. Accordingly, the filter characteristics of the second to fourth acoustic wave filters 4 to 6 do not easily deteriorate by the first higher-order mode. The fact that the frequency of the first higher-order mode is located outside the second to fourth pass bands by satisfying the above conditions will be described in more detail below.

$$V_h = a^{(3)}_{T_{LT}}\left((T_{LT} + c_{T_{LT}})^3 + b^{(3)}_{T_{LT}}\right) + \qquad \text{Expression (1)}$$
$$a^{(2)}_{T_{LT}}\left((T_{LT} + c_{T_{LT}})^2 + b^{(2)}_{T_{LT}}\right) + a^{(1)}_{T_{LT}}(T_{LT} + c_{T_{LT}}) +$$
$$a^{(2)}_{T_S}\left((T_S + c_{T_S})^2 + b^{(2)}_{T_S}\right) + a^{(1)}_{T_S}(T_S + c_{T_S}) +$$
$$a^{(2)}_{T_N}\left((T_N + c_{T_N})^2 + b^{(2)}_{T_N}\right) + a^{(1)}_{T_N}(T_N + c_{T_N}) +$$
$$a^{(1)}_{T_E}(T_E + c_{T_E}) + a^{(5)}_{\psi_{Si}}((\psi_{Si} + c_{\psi_{Si}})^5 + b^{(5)}_{Si}) +$$
$$a^{(4)}_{\psi_{Si}}((\psi_{Si} + c_{\psi_{Si}})^4 + b^{(4)}_{\psi_{Si}}) + a^{(3)}_{\psi_{Si}}((\psi_{Si} + c_{\psi_{Si}})^3 + b^{(3)}_{\psi_{Si}}) +$$
$$a^{(2)}_{\psi_{Si}}((\psi_{Si} + c_{\psi_{Si}})^2 + b^{(2)}_{\psi_{Si}}) + a^{(1)}_{\psi_{Si}}(\psi_{Si} + c_{\psi_{Si}}) + e$$

$$f^{(n)}_{h_{s\_t}} = \frac{V_{h_{s\_t}}}{\lambda^{(n)}_t}, (s = 1, 2, 3) \qquad \text{Expression (2)}$$

$$f^{(n)}_{hs\_t} > f^{(m)}_u \qquad \text{Expression (3)}$$

$$f^{(n)}_{hs\_t} < f^{(m)}_l \qquad \text{Expression (4)}$$

In place of an acoustic velocity $V_h$ represented by the expression (1), it is more preferable to use the acoustic velocity $V_h$ represented by the following expression (5). In this case, a ripple by the higher-order mode is more unlikely to occur in the other acoustic wave filter.

$$V_h = a^{(2)}_{T_{LT}}\left((T_{LT} - c_{T_{LT}})^2 - b^{(2)}_{T_{LT}}\right) + a^{(1)}_{T_{LT}}(T_{LT} - c_{T_{LT}}) + \qquad \text{Expression (5)}$$
$$a^{(2)}_S\left((T_S - c_{T_S})^2 - b^{(2)}_{T_S}\right) + a^{(1)}_{T_S}(T_S - c_{T_S}) +$$
$$a^{(3)}_{T_N}\left((T_N - c_{T_N})^3 - b^{(3)}_{T_N}\right) + a^{(2)}_{T_N}\left((T_N - c_{T_N})^2 - b^{(2)}_{T_N}\right) +$$
$$a^{(1)}_{T_N}(T_N - c_{T_N}) + a^{(1)}_{T_E}(T_E - c_{T_E}) +$$
$$a^{(4)}_{\psi_{Si}}((\psi_{Si} - c_{\psi_{Si}})^4 - b^{(4)}_{\psi_{Si}}) + a^{(3)}_{\psi_{Si}}((\psi_{Si} - c_{\psi_{Si}})^3 - b^{(3)}_{\psi_{Si}}) +$$
$$a^{(2)}_{\psi_{Si}}((\psi_{Si} - c_{\psi_{Si}})^2 - b^{(2)}_{\psi_{Si}}) + a^{(1)}_{\psi_{Si}}(\psi_{Si} - c_{\psi_{Si}}) +$$
$$a^{(1)}_{\theta_{LT}}(\theta_{LT} - c_{\theta_{LT}}) + d_{T_{LT}T_S}(T_{LT} - c_{T_{LT}})(T_S - c_{T_S}) +$$
$$d_{T_{LT}T_N}(T_{LT} - c_{LT})(T_N - c_{T_N}) +$$
$$d_{T_{LT}\psi_{Si}}(T_{LT} - c_{T_{LT}})(\psi_{Si} - c_{\psi_{Si}}) +$$

-continued $$d_{T_S T_N}(T_S - c_{T_S})(T_N - c_{T_N}) +$$

$$d_{T_N \psi_{Si}}(T_N - c_{T_N})(\psi_{Si} - c_{\psi_{Si}}) +$$

$$d_{T_N \theta_{LT}}(T_N - c_{T_N})(\theta_{LT} - c_{\theta_{LT}}) +$$

$$d_{T_E \psi_{Si}}(T_E - c_{T_E})(\psi_{Si} - c_{\psi_{Si}}) +$$

$$d_{\psi_{Si} \theta_{LT}}(\psi_{Si} - c_{\psi_{Si}})(\theta_{LT} - c_{\theta_{LT}}) + e$$

Note that in the expression (1) to expression (4), h indicates a higher-order mode, m indicates an m-th (m>n) acoustic wave filter (m), and n indicates an n-th acoustic wave filter (n). Furthermore, t indicates a t-th element (acoustic wave resonator) in the n-th filter. Furthermore, $f_{hs\_t}^{(n)}$ indicates a frequency of a higher-order mode in the acoustic wave resonator (t) included in the acoustic wave filter (n). Note that s is 1, 2, or 3, $f_{hs\_t}^{(n)}$ indicates a frequency of the first higher-order mode when s is 1, indicates a frequency of the second higher-order mode when s is 2, and indicates a frequency of the third higher-order mode when s is 3. Furthermore, $f_u^{(m)}$ is a frequency of a high band side end portion of the pass band in the acoustic wave filter (m). Furthermore, $f_l^{(m)}$ is a frequency of a low band side end portion of the pass band in the acoustic wave filter (m). In addition, in the present specification, the wavelength normalized thickness is a thickness obtained by normalizing a thickness by the wavelength of the IDT electrode. Here, the wavelength refers to a wavelength λ determined by an electrode finger pitch of the IDT electrode. Accordingly, the wavelength normalized thickness is a thickness obtained by normalizing an actual thickness with λ being 1, and is a value obtained by dividing the actual thickness by λ. Note that the wavelength λ determined by the electrode finger pitch of the IDT electrode may be determined by an average value of the electrode finger pitch. Here, $\lambda_t^{(n)}$ is a wavelength determined by the electrode finger pitch of the IDT electrode in the acoustic wave resonator (t) included in the acoustic wave filter (n). In this specification, the wavelength normalized thickness may be simply described as a film thickness.

The inventors of preferred embodiments of the present application have discovered that the frequency position of the first higher-order mode is affected by the parameters described above.

Figure 6:
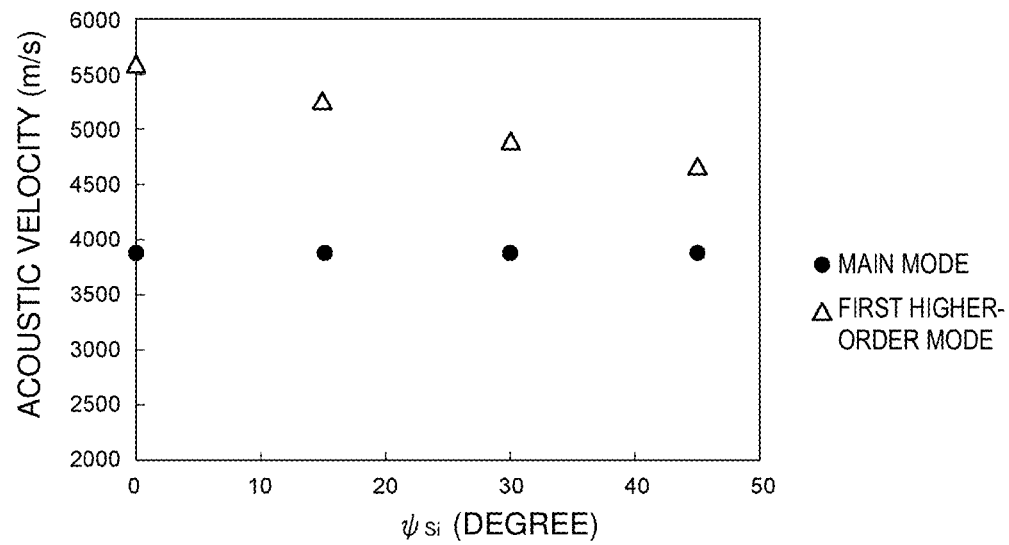
FIG. 6 is a diagram illustrating a relationship between a propagation orientation $\psi_{Si}$ of a support substrate made of silicon and acoustic velocities of a main mode and a first higher-order mode.
Figure 7:
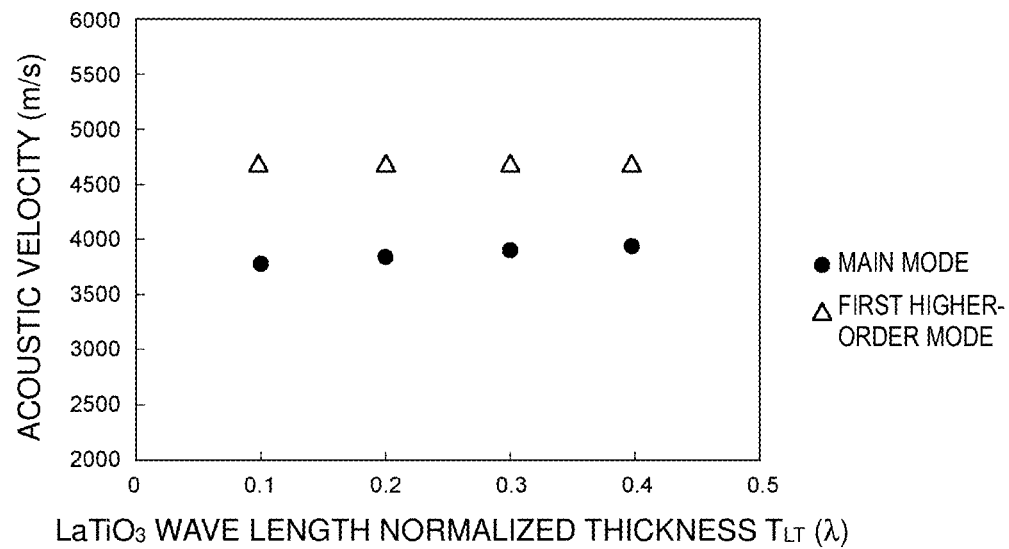
FIG. 7 is a diagram illustrating a relationship between a wavelength normalized thickness of a piezoelectric body made of lithium tantalate and the acoustic velocities of the main mode and the first higher-order mode.
Figure 8:
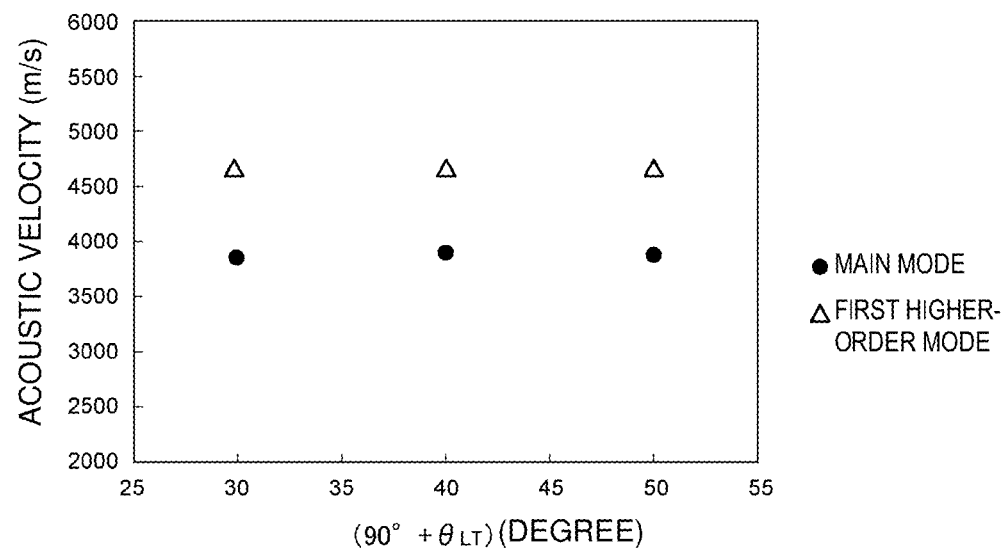
FIG. 8 is a diagram illustrating a relationship between a cut-angle (about $90°+\theta_{LT}$) of the piezoelectric body made of lithium tantalate and the acoustic velocities of the main mode and the first higher-order mode.
Figure 9:
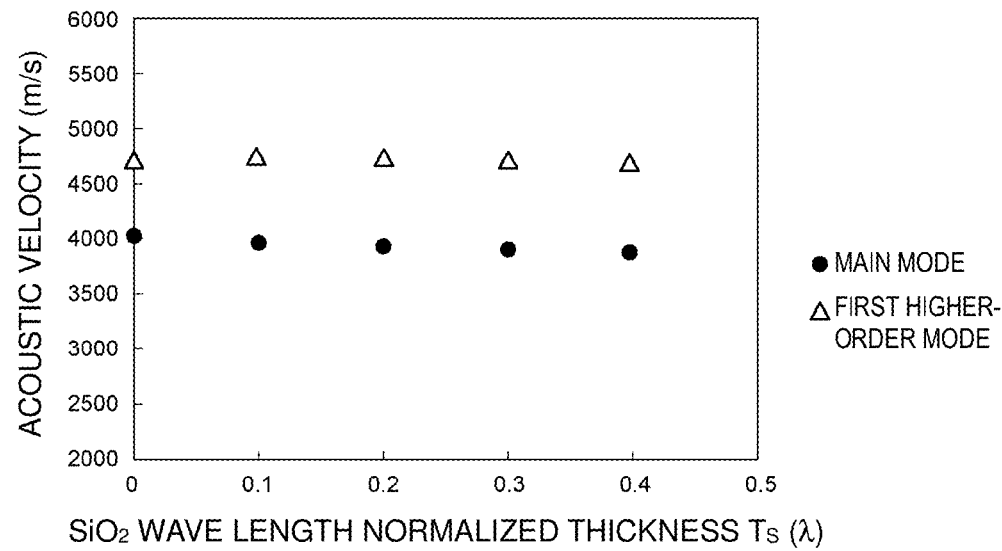
FIG. 9 is a diagram illustrating a relationship between a wavelength normalized thickness of a silicon oxide film and the acoustic velocities of the main mode and the first higher-order mode.
Figure 10:
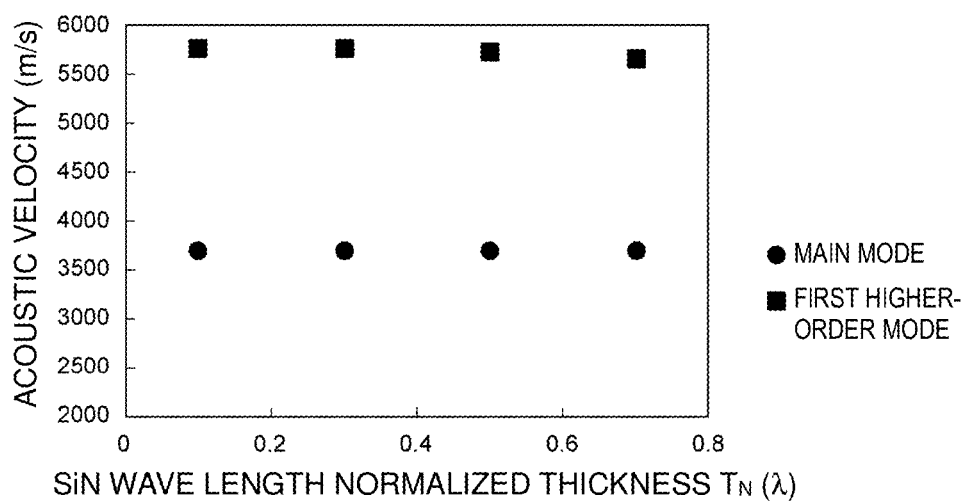
FIG. 10 is a diagram illustrating a relationship between a wavelength normalized thickness of a silicon nitride film and the acoustic velocities of the main mode and the first higher-order mode.
Figure 11:
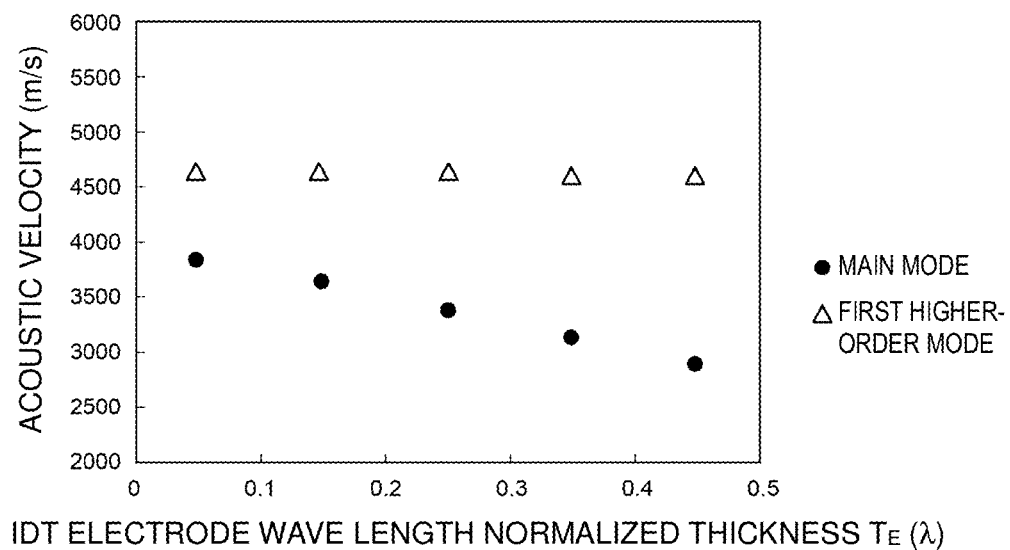
FIG. 11 is a diagram illustrating a relationship between a wavelength normalized thickness of an interdigital transducer (IDT) electrode and the acoustic velocities of the main mode and the first higher-order mode.

As illustrated in FIG. 6, according to the propagation orientation $\psi_{Si}$ of the support substrate made of silicon, the acoustic velocity in the main mode hardly changes but the acoustic velocity in the first higher-order mode greatly changes. As illustrated in FIG. 7, the acoustic velocity in the first higher-order mode changes according to the wavelength normalized thickness $T_{LT}$ of the piezoelectric body made of lithium tantalate. As illustrated in FIG. 8, the acoustic velocity in the first higher-order mode also changes according to a cut-angle of the piezoelectric body made of lithium tantalate, that is, (about 90°+$\theta_{LT}$). As illustrated in FIG. 9, the acoustic velocity in the first higher-order mode also slightly changes according to the wavelength normalized thickness $T_S$ of the silicon oxide film. As illustrated in FIG. 10, it can be seen that the acoustic velocity in the first higher-order mode also changes according to the wavelength normalized thickness $T_N$ of the silicon nitride film. Additionally, as illustrated in FIG. 11, the acoustic velocity in the first higher-order mode also slightly changes according to the wavelength normalized thickness $T_E$ of the IDT electrode. The inventors of preferred embodiments of the present application freely changed these parameters to determine the acoustic velocity in the first higher-order mode. As a result, it has been discovered that the acoustic velocity in the first higher-order mode is expressed by the expression (1). Additionally, it has been confirmed that the coefficients in the expression (1) may be values shown in Table 7 indicated below for each crystal orientation of the support substrate made of silicon. Furthermore, it has been confirmed that the coefficients in the expression (5) may be values shown in Table 8 indicated below for each crystal orientation of the support substrate made of silicon.

TABLE 7

| s = 1, First Higher-Order Mode | Si(100) | Si(110) | Si(111) |
|---|---|---|---|
| $a_{TLT}^{(3)}$ | 0 | 0 | 0 |
| $a_{TLT}^{(2)}$ | 0 | 0 | 0 |
| $a_{TLT}^{(1)}$ | −128.109974 | −84.392576 | −78.4352 |
| $b_{TLT}^{(3)}$ | 0 | 0 | 0 |
| $b_{TLT}^{(2)}$ | 0 | 0 | 0 |
| $c_{TLT}$ | −0.2492038 | −0.247604 | −0.24838 |
| $a_{TS}^{(2)}$ | 0 | 0 | 0 |
| $a_{TS}^{(1)}$ | −109.6889 | −182.2936559 | −485.867 |
| $b_{TS}^{(2)}$ | 0 | 0 | 0 |
| $c_{TS}$ | −0.249363 | −0.2498958 | −0.24942 |
| $a_{TN}^{(2)}$ | −337.59528 | −198.4171235 | −264.804 |
| $a_{TN}^{(1)}$ | −109.08389 | 38.137636 | −20.3216 |
| $b_{TN}^{(2)}$ | −0.0262274 | −0.04671597 | −0.04389 |
| $c_{TN}$ | −0.29617834 | 0.369166 | −0.34988 |
| $a_{TE}^{(1)}$ | 175.4682 | 13.0363945 | 0 |
| $c_{TE}$ | −0.14826 | −0.14979166 | 0 |
| $a_{\psi Si}^{(5)}$ | 0 | 0 | 0 |
| $a_{\psi Si}^{(4)}$ | 0 | 0.000489723 | 0.000503 |
| $a_{\psi Si}^{(3)}$ | 0.0236358 | −5.09E−05 | 0.006871 |
| $a_{\psi Si}^{(2)}$ | −0.0357088 | −1.017335189 | −0.80395 |
| $a_{\psi Si}^{(1)}$ | −34.8157175 | 0 | −5.57553 |
| $b_{\psi Si}^{(5)}$ | 0 | 0 | 0 |
| $b_{\psi Si}^{(4)}$ | 0 | −2150682.513 | −352545 |
| $b_{\psi Si}^{(3)}$ | 0 | −21460.18941 | 2095.948 |
| $b_{\psi Si}^{(2)}$ | −288.415605 | −970.8815104 | −470.617 |
| $c_{\psi Si}$ | −22.5 | −36.8125 | −33.3025 |
| e | 5251.687898 | 5092.365583 | 4851.236 |

TABLE 8

| s = 1, First Higher-Order Mode | Si(100) | Si(110) | Si(111) |
|---|---|---|---|
| $a_{TLT}^{(2)}$ | 0 | 0 | 0 |
| $a_{TLT}^{(1)}$ | 0 | 0 | 0 |
| $b_{TLT}^{(2)}$ | 0 | 0 | 0 |
| $c_{TLT}$ | 0 | 0 | 0 |
| $a_{TS}^{(2)}$ | 0 | 0 | 0 |
| $a_{TS}^{(1)}$ | 0 | 0 | 534.5188318 |
| $b_{TS}^{(2)}$ | 0 | 0 | 0 |
| $c_{TS}$ | 0 | 0 | 0.249010293 |
| $a_{TN}^{(3)}$ | 0 | 0 | 0 |
| $a_{TN}^{(2)}$ | 0 | 0 | 0 |
| $a_{TN}^{(1)}$ | 0 | 0 | −36.51741324 |
| $b_{TN}^{(3)}$ | 0 | 0 | 0 |
| $b_{TN}^{(2)}$ | 0 | 0 | 0 |
| $c_{TN}$ | 0 | 0 | 0.35114806 |
| $a_{TE}^{(1)}$ | 0 | 0 | 0 |
| $c_{TE}$ | 0 | 0 | 0 |
| $a_{\psi Si}^{(4)}$ | 0 | 0 | 0.000484609 |
| $a_{\psi Si}^{(3)}$ | 0.022075968 | 0 | 0.005818261 |
| $a_{\psi Si}^{(2)}$ | −0.18782287 | 0.081701713 | −0.805302317 |
| $a_{\psi Si}^{(1)}$ | −33.85785847 | 10.57201342 | −4.785681077 |
| $b_{\psi Si}^{(4)}$ | 0 | 0 | 351437.8188 |
| $b_{\psi Si}^{(3)}$ | 806.2400011 | 0 | −1862.605341 |
| $b_{\psi Si}^{(2)}$ | 270.2635345 | 986.4812738 | 471.945355 |

TABLE 8-continued

| s = 1, First Higher-Order Mode | Si(100) | Si(110) | Si(111) |
|---|---|---|---|
| $c_{\psi Si}$ | 20.26171875 | 37.73795535 | 32.87410926 |
| $a_{\theta LT}^{(1)}$ | 0 | 0 | 0 |
| $c_{\theta LT}$ | 0 | 0 | 0 |
| $d_{TLTTS}$ | 0 | 0 | 0 |
| $d_{TLTTN}$ | 0 | 0 | 0 |
| $d_{TLT\psi Si}$ | 0 | 0 | 0 |
| $d_{TSTN}$ | 0 | 0 | 1862.994192 |
| $d_{TN\psi Si}$ | 0 | 0 | 0 |
| $d_{TN\theta LT}$ | 0 | 0 | 0 |
| $d_{TE\psi Si}$ | 0 | 0 | 0 |
| $d_{\psi Si\theta LT}$ | 0 | 0 | 0 |
| e | 5317.859375 | 5103.813161 | 4853.204861 |

When the acoustic velocity of the first higher-order mode is denoted as $V_{h1\_t}$, the frequency of the first higher-order mode is represented by $f_{h1\_t}^{(n)} = V_{h1\_t}/\lambda_t^{(n)}$ based on the expression (2). Here, $f_{h1}$ is the frequency of the first higher-order mode, and t is a number of an element such as the resonator or the like of the n-th filter.

In the present preferred embodiment, as indicated by the expression (3) or the expression (4), $f_{h1\_t}$ is higher than $f_u^{(m)}$ or lower than $f_l^{(m)}$. That is, $f_{h1\_t}$ is lower than that of each of the low band side end portions or higher than that of each of the high band side end portions, of the second pass band, the third pass band, and the fourth pass band illustrated in FIG. 4. Therefore, it can be seen that the frequency $f_{h1\_t}^{(n)}$ of the first higher-order mode is not located within the second to fourth pass bands.

Figure 33:
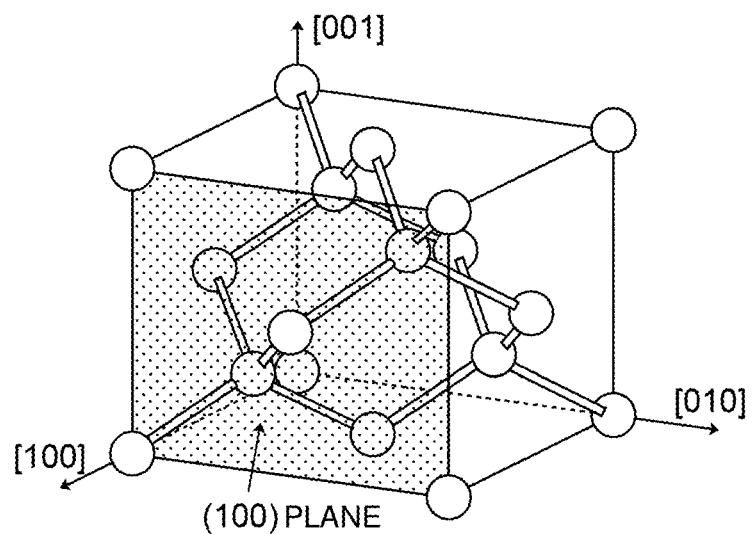
FIG. 33 is a schematic diagram for explaining a crystal orientation.

Here, as illustrated in FIG. 33, an Si (100) indicates a substrate obtained by cutting at a (100) plane orthogonal or substantially orthogonal to a crystal axis represented by a miller index [100] in a crystal structure of silicon having a diamond structure. It should be noted that a crystallographically equivalent plane such as an Si (010) or the like is also included.

Figure 34:
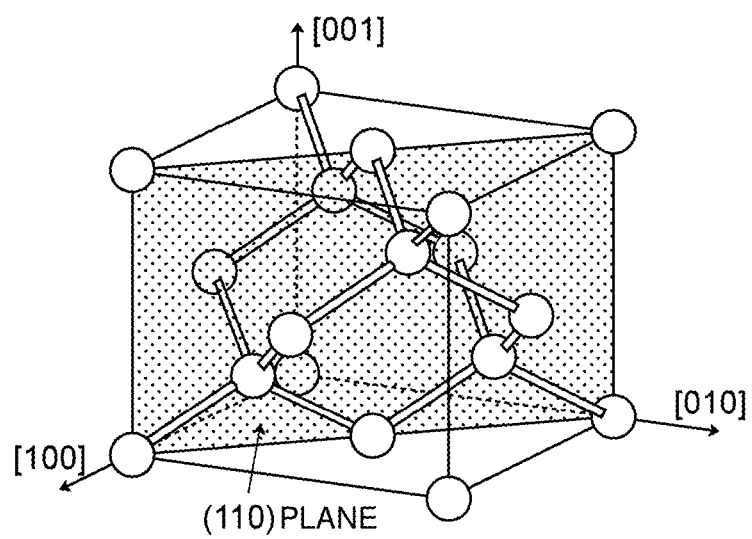
FIG. 34 is a schematic diagram for explaining the crystal orientation.

As illustrated in FIG. 34, an Si (110) indicates a substrate obtained by cutting at a (110) plane orthogonal or substantially orthogonal to a crystal axis represented by a miller index [110] in a crystal structure of silicon having a diamond structure. It should be noted that another crystallographically equivalent plane is also included.

Figure 35:
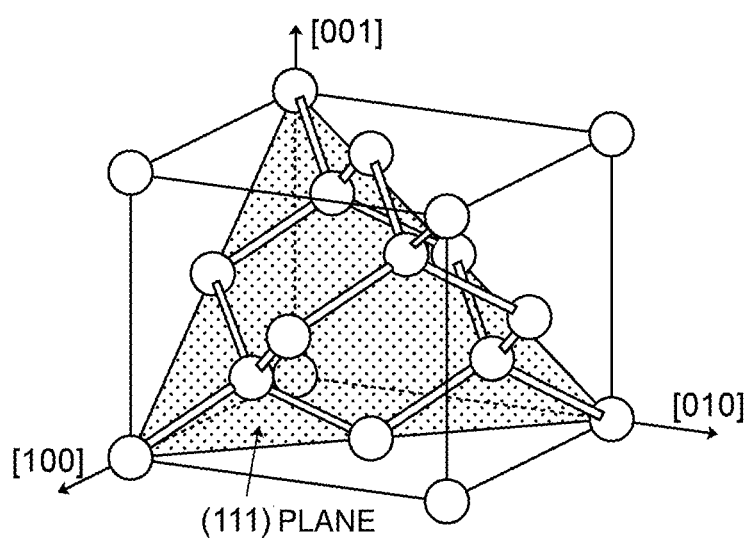
FIG. 35 is a schematic diagram for explaining the crystal orientation.

As illustrated in FIG. 35, an Si (111) indicates a substrate obtained by cutting at a (111) plane orthogonal or substantially orthogonal to a crystal axis represented by a miller index [111] in a crystal structure of silicon having a diamond structure. It should be noted that another crystallographically equivalent plane is also included.

In the above-described expression (1):

a) When the Si (100) (Euler angles are assumed to be ($\varphi_{Si}$=about 0±5°, $\theta_{Si}$=about 0±5°, $\psi_{Si}$)) is used, a range of $\psi_{Si}$ is set to about 0°≤$\psi_{Si}$≤about 45°. However, because of the symmetry of the crystal structure of the Si (100), $\psi_{Si}$ and $\psi_{Si}$±(n×90°) are synonymous with each other (n=1, 2, 3 . . . ). In the same manner, $\psi_{Si}$ and $\psi_{Si}$ are synonymous with each other.

b) When the Si (110) (Euler angles are assumed to be ($\varphi_{Si}$=about −45±5°, $\theta_{Si}$=about −90±5°, $\psi_{Si}$)) is used, a range of $\psi_{Si}$ is set to about 0°≤$\psi_{Si}$≤about 90°. However, because of the symmetry of the crystal structure of the Si (110), $\psi_{Si}$ and $\psi_{Si}$±(n×180°) are synonymous with each other (n=1, 2, 3 . . . ). In the same manner, $\psi_{Si}$ and −$\psi_{Si}$ are synonymous with each other.

c) When the Si (111) (Euler angles are assumed to be ($\varphi_{Si}$=about −45±5°, $\theta_{Si}$=about −54.73561±5°, $\psi_{Si}$)) is used, a range of $\psi_{Si}$ is set to about 0°≤$\psi_{Si}$≤about 60°. However, because of the symmetry of the crystal structure of the Si (111), $\psi_{Si}$ and $\psi_{Si}$±(n×120°) are synonymous with each other (n=1, 2, 3 . . . ). In the same manner, $\psi_{Si}$ and −$\psi_{Si}$ are synonymous with each other.

In addition, although a range of $\theta_{LT}$ is set to about −180°<$\theta_{LT}$≤about 0°, $\theta_{LT}$ and $\theta_{LT}$+180° may be handled as being synonymous with each other.

Note that in this specification, in the Euler angles (within the range of about 0°±5°, θ, within the range of about 0°±15°), "within the range of about 0°±5°" means "within a range of about −5° or more and about +5° or less", and "within the range of about 0°±15°" means "within the range of about −15° or more and about +15° or less".

The wavelength normalized thickness $T_E$ of the IDT electrode 16 is a thickness obtained by converting the wavelength normalized thickness of the electrode layer of the IDT electrode 16 into the film thickness of the IDT electrode made of aluminum based on a density ratio. More specifically, the wavelength normalized thickness $T_E$ is obtained by multiplying a value obtained by dividing the density of the IDT electrode 16 by the density of aluminum, and the wavelength normalized thickness of the IDT electrode 16. However, the electrode material is not limited to Al. Various metals, such as Ti, NiCr, Cu, Pt, Au, Mo, W, or the like, for example, can be used. Alternatively, an alloy including these metals as a main component may be used. Alternatively, a laminated metal film provided by laminating a plurality of metal films made of these metals or the alloy may be used. In this case, the wavelength normalized thickness $T_E$ is a wavelength normalized thickness converted to the thickness of the IDT electrode made of aluminum, from the thickness and density of each electrode layer of the IDT electrode.

Figure 12A:
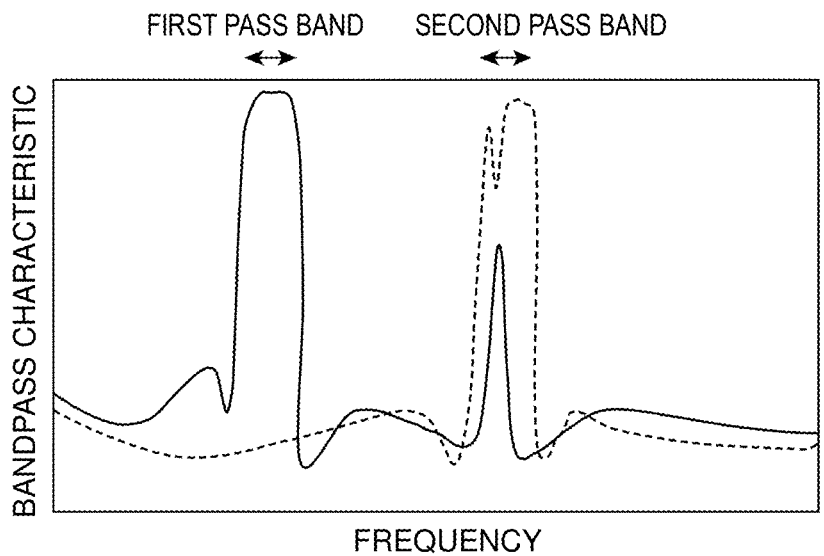
FIG. 12A is a diagram illustrating filter characteristics of a multiplexer of a comparative example.
Figure 12B:
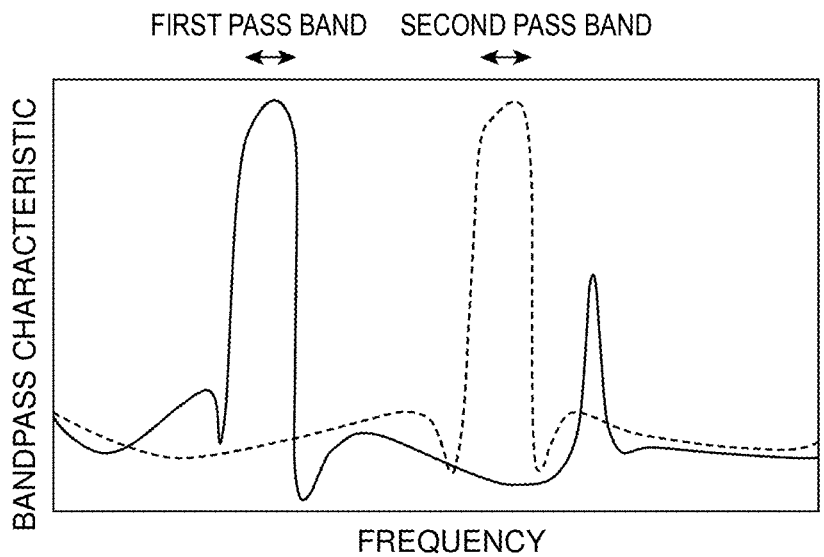
FIG. 12B is a diagram illustrating filter characteristics of the multiplexer according to the first preferred embodiment of the present invention.

FIG. 12A is a diagram illustrating filter characteristics of a multiplexer of a comparative example in which the acoustic wave resonator does not satisfy the expression (3) or the expression (4), and FIG. 12B is a diagram illustrating filter characteristics of the multiplexer according to the first preferred embodiment.

FIGS. 12A and 12B each illustrate the filter characteristics of the first acoustic wave filter and the second acoustic wave filter. The solid line indicates the filter characteristics of the first acoustic wave filter. As indicated by the broken line in FIG. 12A, a ripple appears in the pass band in the filter characteristics of the second acoustic wave filter. This ripple is caused by a response of the higher-order mode of the acoustic wave resonator in the first acoustic wave filter. In contrast, as illustrated in FIG. 12B, in the multiplexer according to the first preferred embodiment, such a ripple does not appear in the pass band of the second acoustic wave filter. That is, since the acoustic wave resonator is configured so as to satisfy the expression (3) or the expression (4), the ripple does not appear in the second pass band of the second acoustic wave filter.

Figure 13:
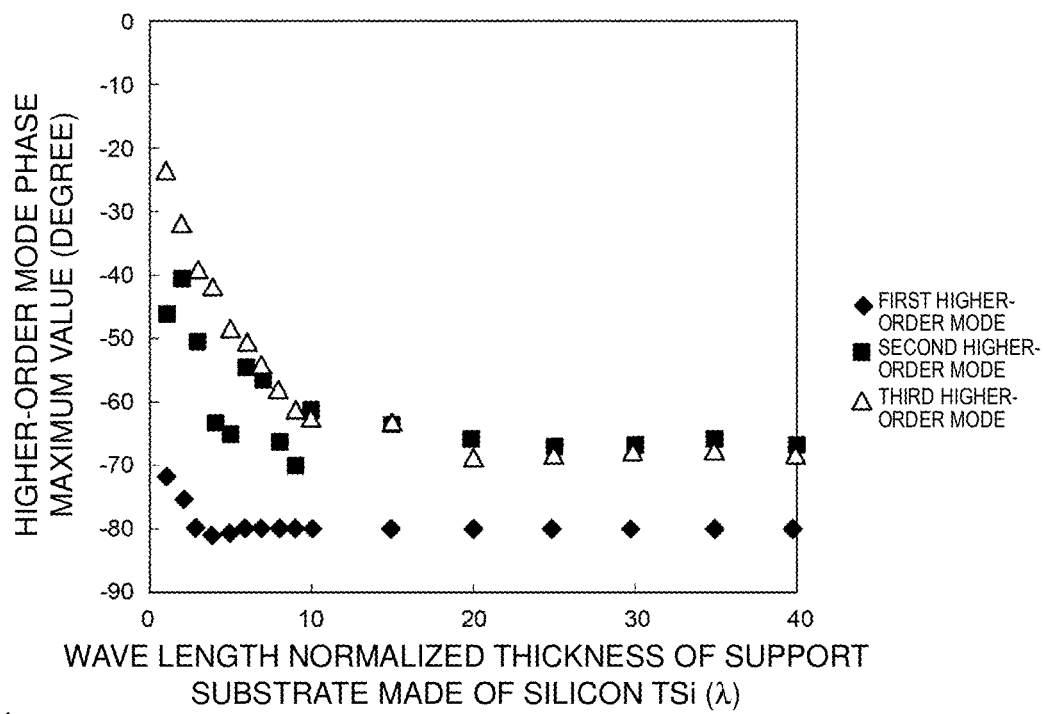
FIG. 13 is a diagram illustrating a relationship between a wavelength normalized thickness of the support substrate made of silicon and the phase maximum values of the first higher-order mode, a second higher-order mode, and a third higher-order mode.

FIG. 13 is a diagram illustrating a relationship between the wavelength normalized thickness $T_{Si}$ of the support substrate made of silicon and the phase maximum values of the first higher-order mode, the second higher-order mode, and the third higher-order mode. As is apparent from FIG. 13, it can be seen that when the wavelength normalized thickness $T_{Si}$ of the support substrate made of silicon is larger than about 4λ, the magnitude of the response in the first higher-order mode becomes constant or substantially constant and sufficiently small. Note that when the wavelength normalized thickness $T_{Si}$ of the support substrate is greater than about 10λ, the responses of the second and third higher-order modes also become small, and when the thickness is greater than about 20λ, those in all the first to third higher-order modes become sufficiently small. Therefore, preferably, the wavelength normalized thickness $T_{Si}$ of the support substrate satisfies $T_{Si}$>about 4, for example. More preferably, the wavelength normalized thickness $T_{Si}$ of the support substrate satisfies $T_{Si}$>about 10, for example. Still more preferably, the wavelength normalized thickness $T_{Si}$ of the support substrate satisfies $T_{Si}$>about 20, for example.

In the present preferred embodiment, in at least one acoustic wave resonator of the plurality of acoustic wave resonators of the first acoustic wave filter 3, the frequency of the first higher-order mode satisfies the expression (3) or the expression (4). More preferably, in the acoustic wave resonator closest to the antenna terminal, the frequency position of the response in the higher-order mode satisfies the expression (3) or the expression (4). This is because the influence of a higher-order mode in the acoustic wave resonator closest to the antenna terminal tends to appear greatly in the pass bands of the second to fourth acoustic wave filters 4 to 6, in comparison with another acoustic wave resonator.

More preferably, in all of the acoustic wave resonators, the frequency position in the first higher-order mode satisfies the expression (3) or the expression (4). With this, the ripple caused by the response of the first higher-order mode is less likely to occur in the pass bands of the second to fourth acoustic wave filters 4 to 6.

When the structure of preferred embodiments of the present invention is applied, as described above, the higher-order mode tends to be confined in a portion where the silicon oxide film 14 and the piezoelectric body 15 are laminated, but by making the wavelength normalized thickness of the piezoelectric body 15 to be equal to or less than about 3.5λ, for example, the laminated portion of the silicon oxide film 14 and the piezoelectric body 15 becomes thinner, so that the higher-order mode is unlikely to be confined.

More preferably, the film thickness of the piezoelectric body 15 made of $LiTaO_3$ is equal to or less than about 2.5λ, for example, and in this case, an absolute value of a temperature coefficient of frequency TCF can be decreased. Additionally, preferably, the film thickness of the piezoelectric body 15 made of $LiTaO_3$ is equal to or less than about 1.5λ, for example. In this case, an electromechanical coupling coefficient can be easily adjusted. Additionally, more preferably, the film thickness of the piezoelectric body 15 made of $LiTaO_3$ is equal to or less than about 0.52λ, for example. In this case, the electromechanical coupling coefficient can be easily adjusted within a wide range.

Second Preferred Embodiment

In a second preferred embodiment of the present invention, a ripple in the second higher-order mode, not in the first higher-order mode, is not located in the pass bands of the second to fourth filters 4 to 6. This will be described with reference to FIG. 14 to FIG. 19.

Figure 14:
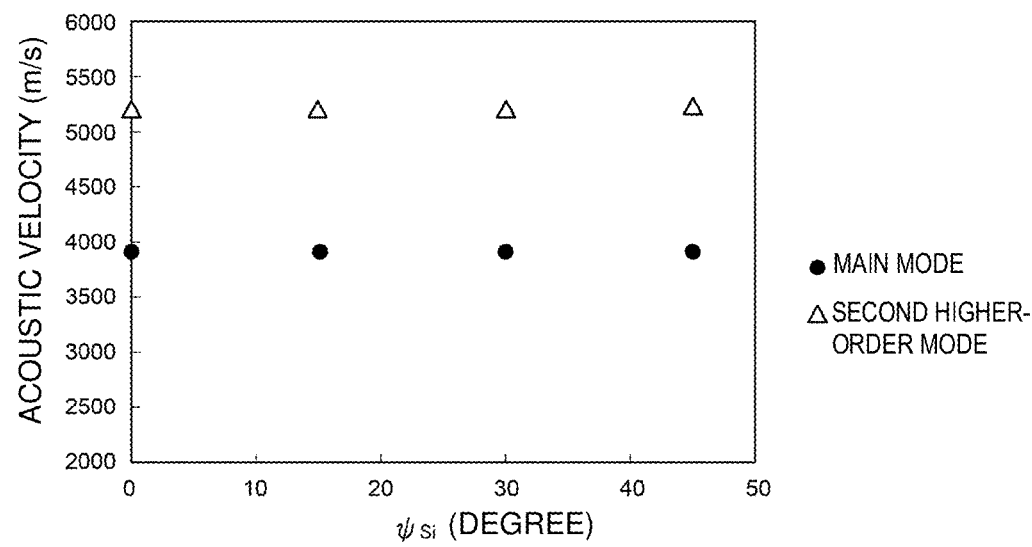
FIG. 14 is a diagram illustrating a relationship between the propagation orientation $\psi_{Si}$ of the support substrate made of silicon and acoustic velocities of the main mode and the second higher-order mode.
Figure 15:
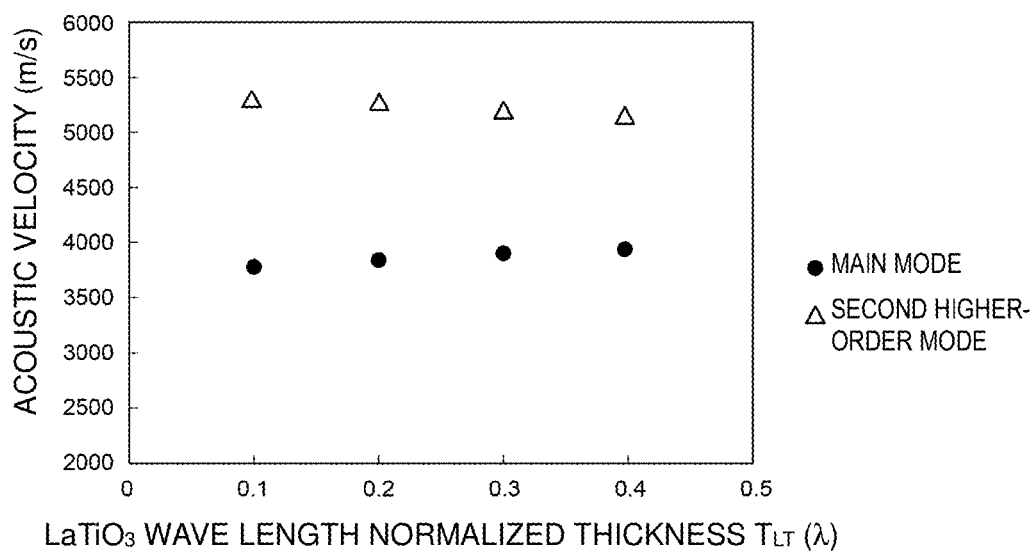
FIG. 15 is a diagram illustrating a relationship between the wavelength normalized thickness of the piezoelectric body made of lithium tantalate and the acoustic velocities of the main mode and the second higher-order mode.
Figure 16:
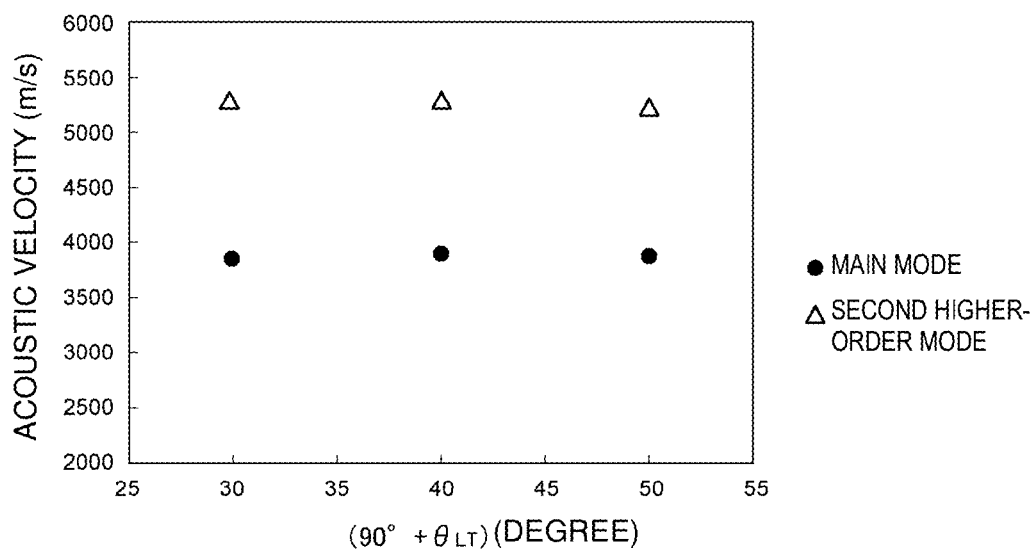
FIG. 16 is a diagram illustrating a relationship between the cut-angle (about $90°+\theta_{LT}$) of the piezoelectric body made of lithium tantalate and the acoustic velocities of the main mode and the second higher-order mode.
Figure 17:
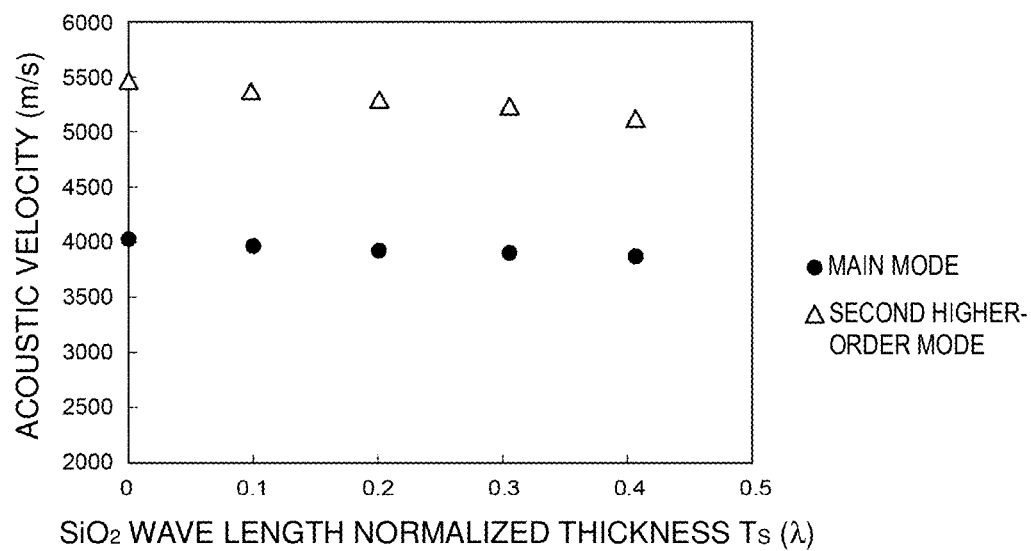
FIG. 17 is a diagram illustrating a relationship between the wavelength normalized thickness of the silicon oxide film and the acoustic velocities of the main mode and the second higher-order mode.
Figure 18:
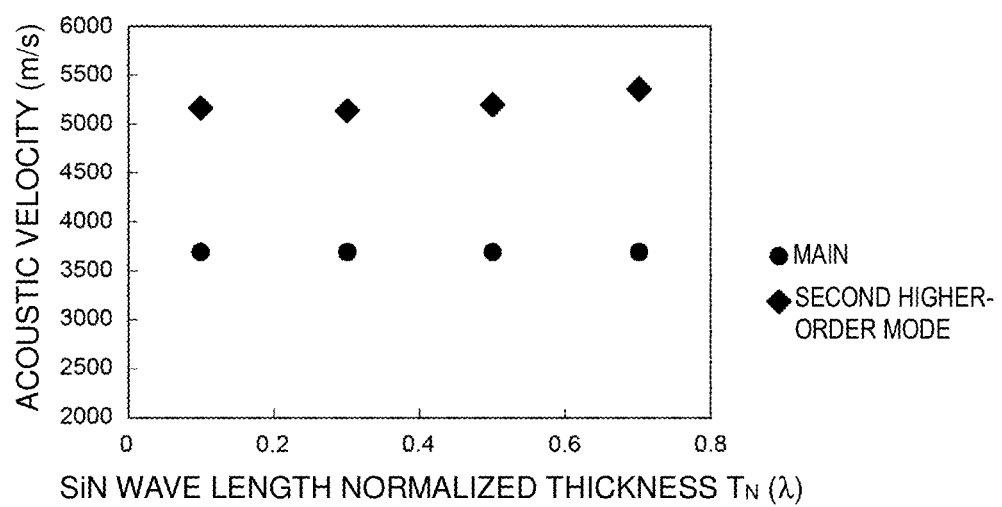
FIG. 18 is a diagram illustrating a relationship between the wavelength normalized thickness of the silicon nitride film and the acoustic velocities of the main mode and the second higher-order mode.
Figure 19:
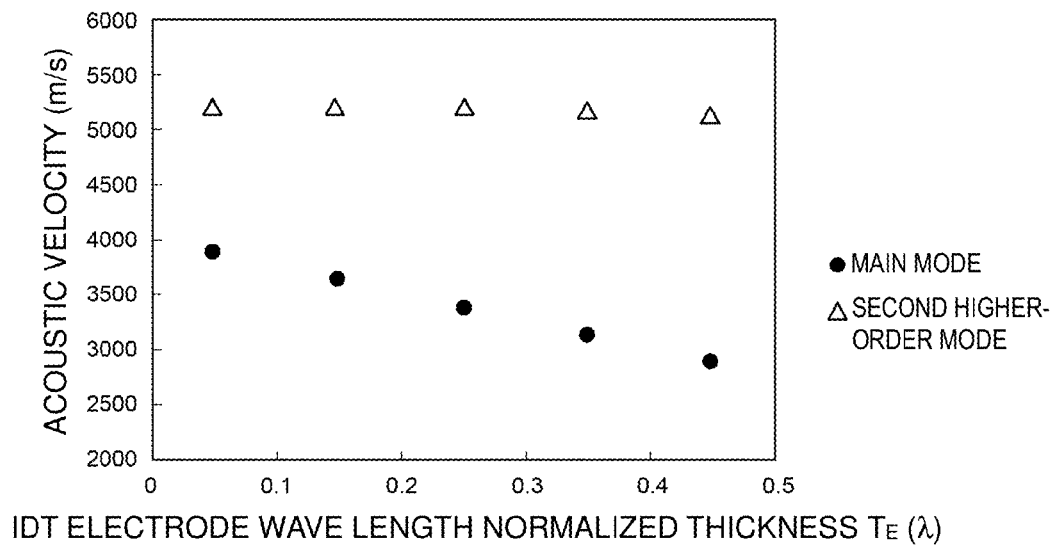
FIG. 19 is a diagram illustrating a relationship between the wavelength normalized thickness of the IDT electrode and the acoustic velocities of the main mode and the second higher-order mode.

As illustrated in FIG. 14, an acoustic velocity in the second higher-order mode changes according to the propagation orientation $\psi_{Si}$. In the same or similar manner, as illustrated in FIG. 15, the acoustic velocity in the second higher-order mode also changes according to the wavelength normalized thickness $T_{LT}$ of the piezoelectric body made of lithium tantalate. As illustrated in FIG. 16, the acoustic velocity in the second higher-order mode also changes according to a cut-angle (about $90°+\theta_{LT}$) of the piezoelectric body made of lithium tantalate. As illustrated in FIG. 17, the acoustic velocity in the second higher-order mode also changes according to the wavelength normalized thickness $T_S$ of the silicon oxide film. As illustrated in FIG. 18, the acoustic velocity in the second higher-order mode also changes according to the wavelength normalized thickness $T_N$ of the silicon nitride film. As illustrated in FIG. 19, the acoustic velocity in the second higher-order mode also changes according to the wavelength normalized thickness $T_E$ of the IDT electrode. From the results illustrated in FIG. 14 to FIG. 19, in the same or similar manner as in the first preferred embodiment, it has been discovered that the acoustic velocity in the second higher-order mode is also represented by the expression (1) or the expression (5). However, in a case of the second higher-order mode, it is necessary for the coefficient in the expression (1) to have values shown in Table 9 indicated below for each crystal orientation of the support substrate made of silicon. Furthermore, in the case of the second higher-order mode, it is necessary for the coefficient in the expression (5) to have values shown in Table 10 indicated below for each crystal orientation of the support substrate made of silicon.

TABLE 9

| s = 2, Second Higher-Order Mode | Si(100) | Si(110) | Si(111) |
|---|---|---|---|
| $a_{TLT}^{(3)}$ | 0 | 0 | 0 |
| $a_{TLT}^{(2)}$ | 2285.602094 | 3496.38329 | −2357.61 |
| $a_{TLT}^{(1)}$ | −538.88053 | −1081.86178 | −1308.55 |
| $b_{TLT}^{(3)}$ | 0 | 0 | 0 |
| $b_{TLT}^{(2)}$ | −0.0016565 | −0.001741462 | −0.00166 |
| $c_{TLT}$ | −0.251442 | −0.2501547 | −0.2497 |
| $a_{TS}^{(2)}$ | −3421.09725 | −4927.3017 | −3633.11 |
| $a_{TS}^{(1)}$ | −1054.253 | −992.33158 | −1006.69 |
| $b_{TS}^{(2)}$ | −0.0016565 | −0.2551083 | −0.00166 |
| $c_{TS}$ | −0.2514423 | 0.2551 | −0.25019 |
| $a_{TN}^{(2)}$ | 1042.56084 | −423.87007 | −135.325 |
| $a_{TN}^{(1)}$ | 159.11219 | 80.7948 | −106.73 |
| $b_{TN}^{(2)}$ | −0.02613905 | −0.05219411 | −0.0486 |
| $c_{TN}$ | −0.2961538 | −0.36996 | −0.39884 |
| $a_{TE}^{(1)}$ | −171.153846 | −637.391944 | −585.696 |
| $c_{TE}$ | 0.15 | −0.151238 | −0.14932 |
| $a_{\psi Si}^{(5)}$ | 0 | 0 | 0 |
| $a_{\psi Si}^{(4)}$ | 0 | −0.00098215 | −0.00016 |
| $a_{\psi Si}^{(3)}$ | −0.0038938 | −0.002109232 | −0.00037 |
| $a_{\psi Si}^{(2)}$ | −0.00306409 | 2.25463 | 0.224668 |
| $a_{\psi Si}^{(1)}$ | 2.8538478 | 23.6872515 | 1.243381 |
| $b_{\psi Si}^{(5)}$ | 0 | 0 | 0 |
| $b_{\psi Si}^{(4)}$ | 0 | −2959279.229 | −399785 |
| $b_{\psi Si}^{(3)}$ | 234.60436 | −21928.45828 | 5.712562 |
| $b_{\psi Si}^{(2)}$ | −289.82063 | −1407.041187 | −535.077 |
| $c_{\psi Si}$ | 22.78846 | −39.1640886 | −29.9806 |
| e | 5282.98076 | 5338.606811 | 5411.395 |

TABLE 10

| s = 2, Second Higher-Order Mode | Si(100) | Si(110) | Si(111) |
|---|---|---|---|
| $a_{TLT}^{(2)}$ | 0 | 0 | 0 |
| $a_{TLT}^{(1)}$ | −608.2898721 | −1003.471473 | −1270.018362 |
| $b_{TLT}^{(2)}$ | 0 | 0 | 0 |
| $c_{TLT}$ | 0.25 | 0.253954306 | 0.249121666 |
| $a_{TS}^{(2)}$ | 0 | 0 | 0 |
| $a_{TS}^{(1)}$ | −1140.654415 | −1030.75867 | −1039.830158 |
| $b_{TS}^{(2)}$ | 0 | 0 | 0 |

TABLE 10-continued

| s = 2, Second Higher-Order Mode | Si(100) | Si(110) | Si(111) |
|---|---|---|---|
| $c_{TS}$ | 0.249966079 | 0.255272408 | 0.250032531 |
| $a_{TN}^{(3)}$ | −3219.596725 | 0 | 2822.963403 |
| $a_{TN}^{(2)}$ | 555.8662451 | 0 | −264.9680504 |
| $a_{TN}^{(1)}$ | 465.8636149 | 53.04201209 | −288.9461645 |
| $b_{TN}^{(3)}$ | 0.001081155 | 0 | 0.000392787 |
| $b_{TN}^{(2)}$ | 0.04654949 | 0 | 0.48934743 |
| $c_{TN}$ | 0.378426052 | 0.376449912 | 0.392908263 |
| $a_{TE}^{(1)}$ | 0 | −622.7635558 | −614.5885324 |
| $c_{TE}$ | 0 | 0.151274165 | 0.156815224 |
| $a_{\psi Si}^{(4)}$ | 0 | −0.00096736 | −0.000227305 |
| $a_{\psi Si}^{(3)}$ | 0 | −0.006772454 | −0.000220017 |
| $a_{\psi Si}^{(2)}$ | 0 | 2.203099663 | 0.31727324 |
| $a_{\psi Si}^{(1)}$ | 0.833288758 | 28.15768206 | 0.648998523 |
| $b_{\psi Si}^{(4)}$ | 0 | 2959964.533 | 396965.3474 |
| $b_{\psi Si}^{(3)}$ | 0 | 19143.61126 | 87.44425969 |
| $b_{\psi Si}^{(2)}$ | 0 | 1447.367657 | 532.0008856 |
| $c_{\psi Si}$ | 22.51017639 | 40.50966608 | 29.90240729 |
| $a_{\theta LT}^{(1)}$ | −1.501270796 | −2.076046604 | −2.376979261 |
| $c_{\theta LT}$ | −52.08683853 | −50.82249651 | −49.04879639 |
| $d_{TLTTS}$ | 0 | 0 | 0 |
| $d_{TLTTN}$ | 0 | 0 | 0 |
| $d_{TLT\psi Si}$ | 0 | 16.61849238 | 0 |
| $d_{TSTN}$ | 0 | 1820.795615 | 1482.11565 |
| $d_{TN\psi Si}$ | 0 | 3.625908485 | −3.131543418 |
| $d_{TN\theta LT}$ | 0 | 0 | 1607.412093 |
| $d_{TE\psi Si}$ | 0 | 0 | 0 |
| $d_{\psi Si\theta LT}$ | 0 | 0 | 0.089566113 |
| e | 5326.187246 | 5356.1100930 | 5418.323508 |

From the acoustic velocity $V_{h2\_t}$ in the second higher-order mode obtained as described above, based on the expression (2), the frequency position $f_{h2\_t}^{(n)}=V_{h2\_t}/\lambda_t^{(n)}$ of the response in the second higher-order mode is obtained. In the second preferred embodiment, the frequency position $f_{h2\_t}^{(n)}$ of the second higher-order mode is set so as to satisfy the following expression (3A) or expression (4A). Accordingly, in the second preferred embodiment, the response of the second higher-order mode is located outside the second to fourth pass bands of the second to fourth acoustic wave filters 4 to 6. Accordingly, a ripple in the filter characteristics of the second to fourth acoustic wave filters 4 to 6 by the response in the second higher-order mode does not easily occur.

$$f_{h2\_t}^{(n)} > f_u^{(m)} \quad \text{Expression (3A)}$$

$$f_{h2\_t}^{(n)} < f_l^{(m)} \quad \text{Expression (4A)}$$

More preferably, in all of the acoustic wave resonators, the frequency position of the response in the second higher-order mode satisfies the expression (3A) or the expression (4A). With this, a ripple caused by the response of the second higher-order mode is less likely to occur in the pass bands of the second to fourth acoustic wave filters 4 to 6.

Third Preferred Embodiment

In a third preferred embodiment of the present invention, a ripple in the third higher-order mode, not that in the first higher-order mode, is not located in the pass bands of the second to fourth filters 4 to 6. This will be described with reference to FIG. 20 to FIG. 25.

Figure 20:
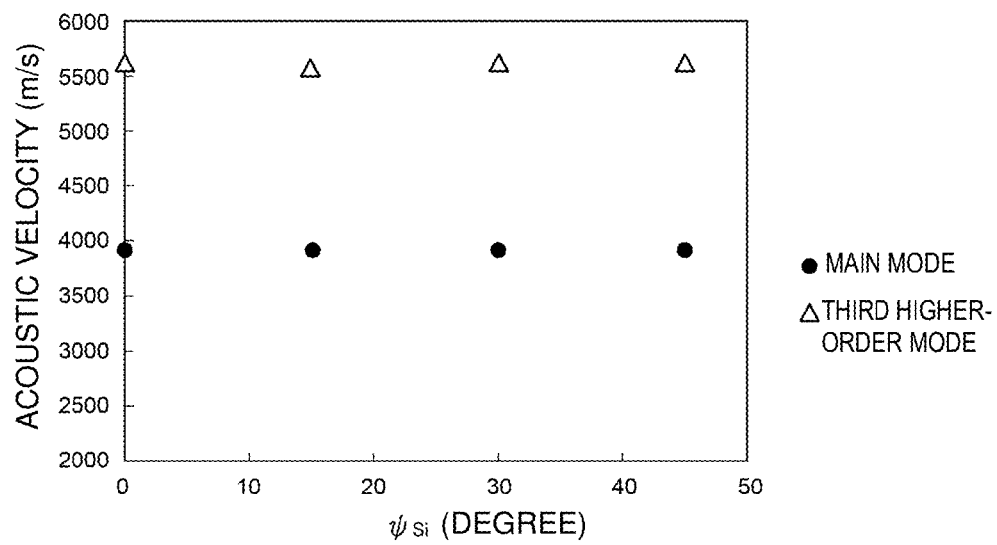
FIG. 20 is a diagram illustrating a relationship between the propagation orientation $\psi_{Si}$ of the support substrate made of silicon and acoustic velocities of the main mode and the third higher-order mode.
Figure 21:
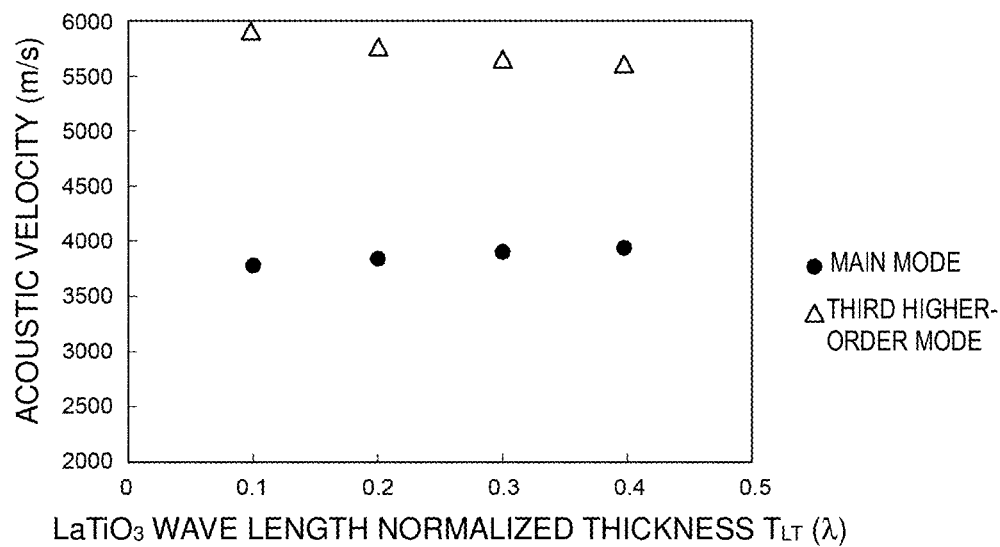
FIG. 21 is a diagram illustrating a relationship between the wavelength normalized thickness of the piezoelectric body made of lithium tantalate and the acoustic velocities of the main mode and the third higher-order mode.
Figure 22:
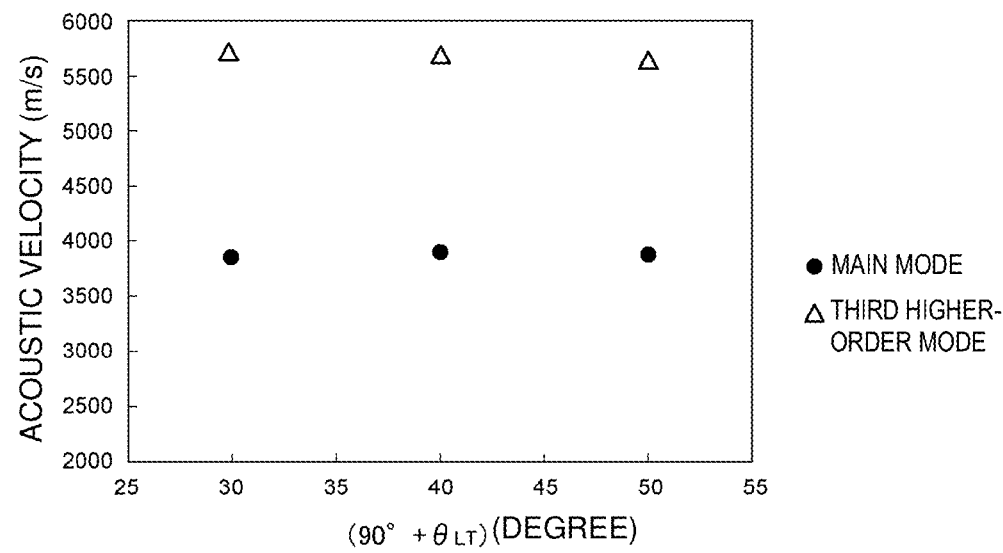
FIG. 22 is a diagram illustrating a relationship between the cut-angle (about $90°+\theta_{LT}$) of the piezoelectric body made of lithium tantalate and the acoustic velocities of the main mode and the third higher-order mode.
Figure 23:
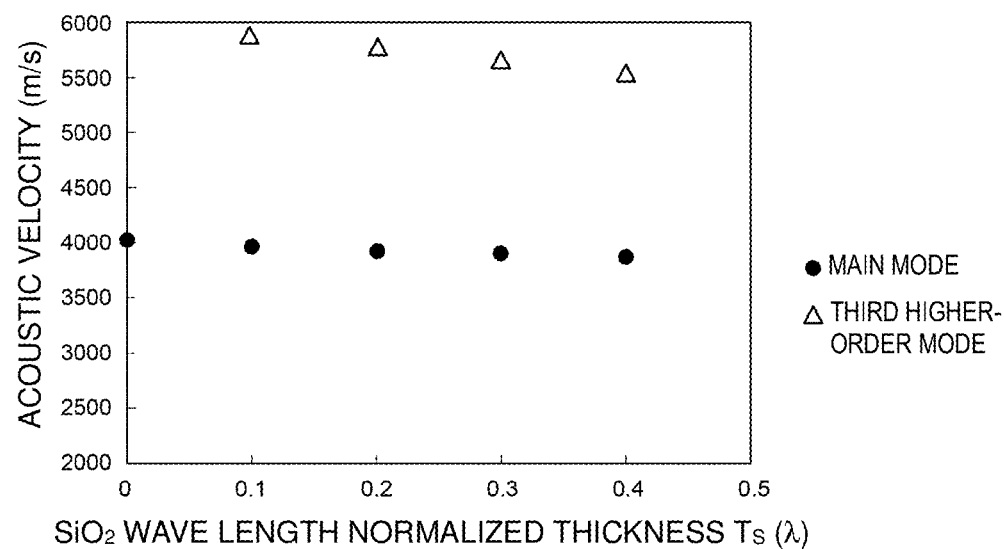
FIG. 23 is a diagram illustrating a relationship between the wavelength normalized thickness of the silicon oxide film and the acoustic velocities of the main mode and the third higher-order mode.
Figure 24:
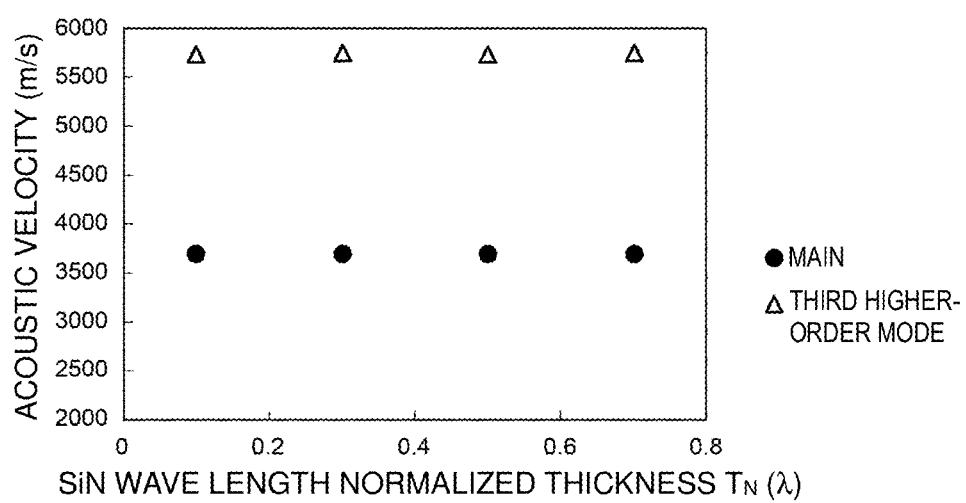
FIG. 24 is a diagram illustrating a relationship between the wavelength normalized thickness of the silicon nitride film and the acoustic velocities of the main mode and the third higher-order mode.
Figure 25:
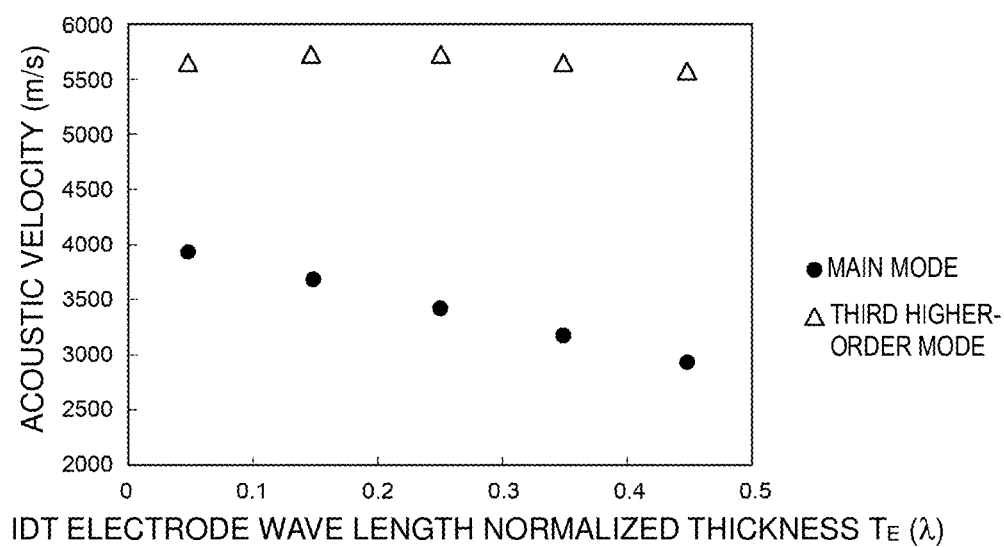
FIG. 25 is a diagram illustrating a relationship between the wavelength normalized thickness of the IDT electrode and the acoustic velocities of the main mode and the third higher-order mode.

As illustrated in FIG. 20, an acoustic velocity in the third higher-order mode changes according to the propagation orientation $\psi_{Si}$. In the same or similar manner, as illustrated in FIG. 21, the acoustic velocity in the third higher-order mode also changes according to the wavelength normalized thickness $T_{LT}$ of the piezoelectric body made of lithium tantalate. As illustrated in FIG. 22, the acoustic velocity in the third higher-order mode also changes according to a cut-angle (about 90°+$\theta_{LT}$) of the piezoelectric body made of lithium tantalate. As illustrated in FIG. 23, the acoustic velocity in the third higher-order mode also changes according to the wavelength normalized thickness $T_S$ of the silicon oxide film. As illustrated in FIG. 24, the acoustic velocity in the third higher-order mode also changes according to the wavelength normalized thickness $T_N$ of the silicon nitride film. As illustrated in FIG. 25, the acoustic velocity in the third higher-order mode also changes according to the wavelength normalized thickness $T_E$ of the IDT electrode. From the results illustrated in FIG. 20 to FIG. 25, in the same or similar manner as in the first preferred embodiment, it has been discovered that the acoustic velocity in the third higher-order mode is also represented by the expression (1) or the expression (5). However, in a case of the third higher-order mode, it is necessary for the coefficient in the expression (1) to have values shown in Table 11 indicated below for each crystal orientation of the support substrate made of silicon. Furthermore, in the case of the third higher-order mode, it is necessary for the coefficient in the expression (5) to have values shown in Table 12 indicated below for each crystal orientation of the support substrate made of silicon.

TABLE 11

| s = 3, Third Higher-Order Mode | Si(100) | Si(110) | Si(111) |
|---|---|---|---|
| $a_{TLT}^{(3)}$ | 0 | 0 | 0 |
| $a_{TLT}^{(2)}$ | 0 | 0 | 3595.754 |
| $a_{TLT}^{(1)}$ | −782.3425 | −1001.237815 | −592.246 |
| $b_{TLT}^{(3)}$ | 0 | 0 | 0 |
| $b_{TLT}^{(2)}$ | 0 | 0 | −0.00164 |
| $c_{TLT}$ | −0.254819 | −0.2578947 | −0.25367 |
| $a_{TS}^{(2)}$ | −14897.59116 | 0 | 0 |
| $a_{TS}^{(1)}$ | −599.8312 | −686.9212563 | −438.155 |
| $b_{TS}^{(2)}$ | −0.00162005 | 0 | 0 |
| $c_{TS}$ | −0.25682 | −0.25546558 | −0.25562 |
| $a_{TN}^{(2)}$ | 0 | 0 | 0 |
| $a_{TN}^{(1)}$ | 0 | 125.557557 | 15.72663 |
| $b_{TN}^{(2)}$ | 0 | 0 | 0 |
| $c_{TN}$ | 0 | −0.349392713 | −0.40872 |
| $a_{TE}^{(1)}$ | −154.8823 | −764.8758717 | −290.54 |
| $c_{TE}$ | −0.14819277 | −0.15303643 | −0.15149 |
| $a_{\psi Si}^{(5)}$ | 0 | 0 | 0 |
| $a_{\psi Si}^{(4)}$ | 0 | 0 | −0.00073 |
| $a_{\psi Si}^{(3)}$ | 0.010467682 | −0.000286554 | −0.00318 |
| $a_{\psi Si}^{(2)}$ | −0.196913569 | 0.67197739 | 0.969126 |
| $a_{\psi Si}^{(1)}$ | −0.3019959 | 0.197549 | 0.359421 |
| $b_{\psi Si}^{(5)}$ | 0 | 0 | 0 |
| $b_{\psi Si}^{(4)}$ | 0 | −0.000204665 | 0 |
| $b_{\psi Si}^{(3)}$ | 0 | −14837.92017 | 670.2052 |
| $b_{\psi Si}^{(2)}$ | −240.3687037 | −1590.306348 | −525.572 |
| $c_{\psi Si}$ | 24.4578313 | −41.9028 | −31.1239 |
| e | 5730.906036 | 5574.008097 | 5675.837 |

TABLE 12

| s = 3, Third Higher-Order Mode | Si(100) | Si(110) | Si(111) |
|---|---|---|---|
| $a_{TLT}^{(2)}$ | −14710.45271 | 0 | 0 |
| $a_{TLT}^{(1)}$ | −764.4056124 | −942.2882121 | −582.1313356 |

TABLE 12-continued s = 3, Third Higher-Order Mode

| Mode | Si(100) | Si(110) | Si(111) |
|---|---|---|---|
| $b_{TLT}^{(2)}$ | 0.001558682 | 0 | 0 |
| $c_{TLT}$ | 0.257243963 | 0.255649419 | 0.251712062 |
| $a_{TS}^{(2)}$ | −21048.18754 | 0 | 0 |
| $a_{TS}^{(1)}$ | −508.6730943 | −705.5211128 | −400.0368899 |
| $b_{TS}^{(2)}$ | 0.001583662 | 0 | 0 |
| $c_{TS}$ | 0.257243963 | 0.254751848 | 0.254367977 |
| $a_{TN}^{(3)}$ | 0 | 0 | 0 |
| $a_{TN}^{(2)}$ | 0 | 0 | 0 |
| $a_{TN}^{(1)}$ | 0 | 97.59462013 | 24.94240828 |
| $b_{TN}^{(3)}$ | 0 | 0 | 0 |
| $b_{TN}^{(2)}$ | 0 | 0 | 0 |
| $c_{TN}$ | 0 | 0.367793031 | 0.404280156 |
| $a_{TE}^{(1)}$ | −276.7311066 | −747.0884117 | 0 |
| $c_{TE}$ | 0.1494796 | 0.152164731 | 0 |
| $a_{\psi Si}^{(4)}$ | 0 | 0 | −0.00075146 |
| $a_{\psi Si}^{(3)}$ | 0.011363183 | 0.003532214 | −0.002666357 |
| $a_{\psi Si}^{(2)}$ | −0.23320473 | 0.218669312 | 1.006728665 |
| $a_{\psi Si}^{(1)}$ | 0.214067146 | −11.24365221 | 0.523191515 |
| $b_{\psi Si}^{(4)}$ | 0 | 0 | 381500.5075 |
| $b_{\psi Si}^{(3)}$ | 180.0564368 | 20914.04622 | −493.6094588 |
| $b_{\psi Si}^{(2)}$ | 257.0498426 | 1548.182277 | 530.6814032 |
| $c_{\psi Si}$ | 22.31890092 | 39.72544879 | 30.82490272 |
| $a_{\theta LT}^{(1)}$ | 0 | 0 | −1.551626054 |
| $c_{\theta LT}$ | 0 | 0 | −49.16731518 |
| $d_{TLTTS}$ | −13796.64706 | 0 | 1575.283126 |
| $d_{TLTTN}$ | 0 | 0 | 0 |
| $d_{TLT\psi Si}$ | 30.35701585 | 0 | 0 |
| $d_{TSTN}$ | 0 | 0 | 0 |
| $d_{TN\psi Si}$ | 0 | 0 | 0 |
| $d_{TN\theta LT}$ | 0 | 0 | 0 |
| $d_{TE\psi Si}$ | 28.27908094 | 0 | 0 |
| $d_{\psi Si\theta LT}$ | 0 | 0 | −0.086544362 |
| e | 5700.075407 | 5563.854277 | 5688.418884 |

From the acoustic velocity $V_{h3\_t}$ in the third higher-order mode obtained as described above, based on the expression (2), the frequency position of the response of the third higher-order mode can be obtained by the frequency position $f_{h3\_t}^{(n)}=V_{h3\_t}/\lambda_t^{(n)}$ of the third higher-order mode. In the third preferred embodiment, the frequency position of the third higher-order mode is set so as to satisfy the following expression (3B) or expression (4B). Accordingly, in the third preferred embodiment, the response of the third higher-order mode is located outside the second to fourth pass bands of the second to fourth acoustic wave filters 4 to 6. Accordingly, a ripple in the filter characteristics of the second to fourth acoustic wave filters 4 to 6 by the response in the third higher-order mode does not easily occur.

$$f_{h3\_t}^{(n)}>f_u^{(m)} \quad \text{Expression (3B)}$$

$$f_{h3\_t}^{(n)}<f_l^{(m)} \quad \text{Expression (4B)}$$

More preferably, in all of the acoustic wave resonators, the frequency position of the response in the third higher-order mode satisfies the expression (3B) or the expression (4B). With this, a ripple caused by the response of the third higher-order mode is less likely to occur in the pass bands of the second to fourth acoustic wave filters 4 to 6.

Fourth Preferred Embodiment

A fourth preferred embodiment of the present invention satisfies all of the first preferred embodiment, the second preferred embodiment, and the third preferred embodiment. A specific structure of a multiplexer according to the fourth preferred embodiment is the same as or similar to those in the first to third preferred embodiments.

In the fourth preferred embodiment, when the acoustic velocities of the first, second, and third higher-order modes are denoted as $V_{h1\_t}$, $V_{h2\_t}$, and $V_{h3\_t}$, respectively, the frequency positions of the responses of the first to third higher-order modes indicated by the expression (2) are represented by $f_{hs\_t}^{(n)}=V_{hs\_t}/\lambda_t^{(n)}$. Here, s is 1, 2, or 3. In the fourth preferred embodiment, all of the frequency $f_{h1\_t}^{(n)}$ of the response in the first higher-order mode, the frequency $f_{h2\_t}^{(n)}$ of the response in the second higher-order mode, and the frequency $f_{h3\_t}^{(n)}$ of the response in the third higher-order mode are higher than $f_u^{(m)}$ or lower than $f_l^{(m)}$. Accordingly, the responses of the first to third higher-order modes are located outside the second to fourth pass bands of the second to fourth acoustic wave filters 4 to 6. Accordingly, deterioration in the filter characteristics of the second to fourth acoustic wave filters is more unlikely to occur.

Therefore, when the conditions of the fourth preferred embodiment are summarized, $f_{hs\_t}^{(n)}$ where, s is 1, 2, or 3) satisfies $f_{hs\_t}^{(n)}>f_u^{(m)}$ or $f_{hs\_t}^{(n)}<f_l^{(m)}$ in any case where s is 1, 2, or 3. Also in the fourth preferred embodiment, it is preferable that $T_{Si}>$about 20, for example, be satisfied, thus making it possible to decrease the magnitude itself of the response in each of the first to third higher-order modes.

In the fourth preferred embodiment, although the responses of the first higher-order mode, the second higher-order mode, and the third higher-order mode are not present in the pass bands of the second to fourth acoustic wave filters which are the other acoustic wave filters, two higher-order modes of the first to third higher-order modes, such as the first higher-order mode and the second higher-order mode, the first higher-order mode and the third higher-order mode, or the second higher-order mode and the third higher-order mode, may be located outside the pass bands of the second to fourth acoustic wave filters. In this case as well, the influence of the higher-order mode can be reduced to a greater extent than in the first to third preferred embodiments.

Figure 26:
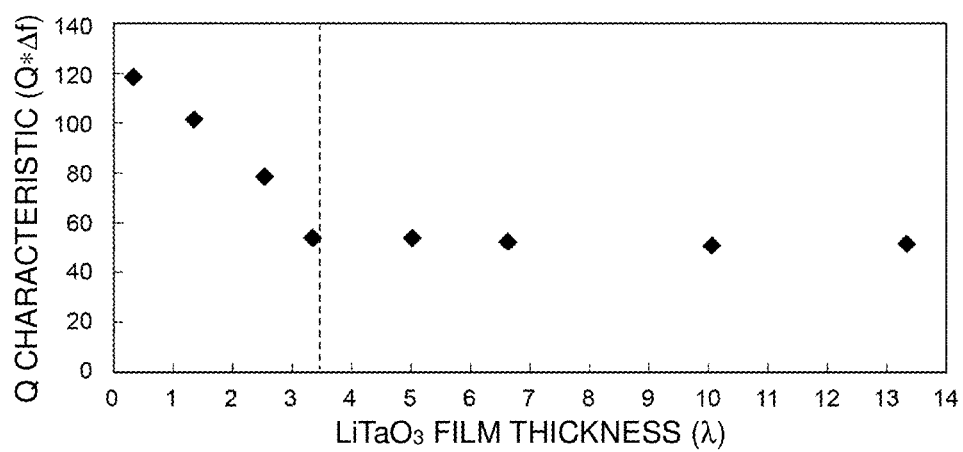
FIG. 26 is a diagram illustrating a relationship between a film thickness of an $LiTaO_3$ film and a Q value in the acoustic wave device.
Figure 27:
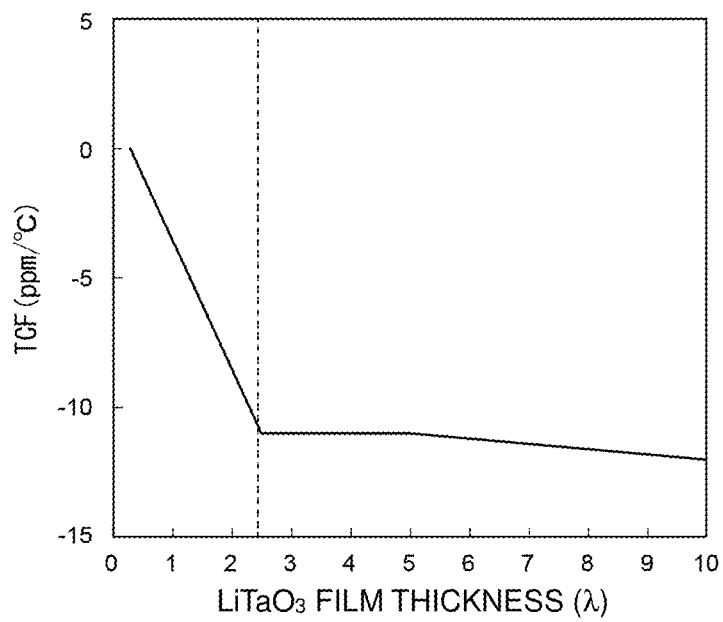
FIG. 27 is a diagram illustrating a relationship between the film thickness of the $LiTaO_3$ film and a temperature coefficient of frequency TCF in the acoustic wave device.
Figure 28:
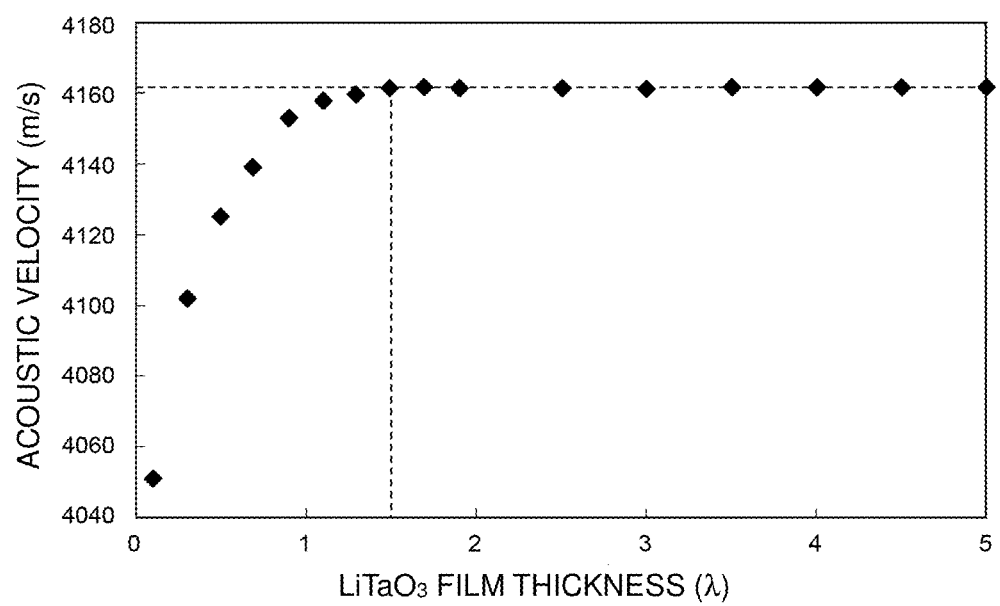
FIG. 28 is a diagram illustrating a relationship between the film thickness of the $LiTaO_3$ film and an acoustic velocity in the acoustic wave device.

FIG. 26 is a diagram illustrating a relationship between a Q value and a film thickness of LiTaO$_3$ in an acoustic wave device in which, for example, a low acoustic velocity film made of an SiO$_2$ film having a film thickness of about 0.35λ and a piezoelectric body made of lithium tantalate having Euler angles (about 0°, about −40.0°, about 0°) are laminated on a high acoustic velocity support substrate made of silicon. The vertical axis in FIG. 26 represents a product of Q characteristics and a band width ratio (Δf) of the resonator. Note that the high acoustic velocity support substrate is a support substrate in which an acoustic velocity of a propagating bulk wave is higher than an acoustic velocity of the acoustic wave propagating through the piezoelectric body. The low acoustic velocity film is a film in which an acoustic velocity of a propagating bulk wave is lower than the acoustic velocity of the acoustic wave propagating through the piezoelectric body. Furthermore, FIG. 27 is a diagram illustrating a relationship between the film thickness of the LiTaO$_3$ film as the piezoelectric body and a temperature coefficient of frequency TCF. FIG. 28 is a diagram illustrating a relationship between the film thickness of the LiTaO$_3$ film and the acoustic velocity. As illustrated in FIG. 26, it is preferable that the film thickness of the LiTaO$_3$ film is equal to or less than about 3.5λ, for example. In this case, the Q value becomes higher than that in the case where the thickness exceeds about 3.5λ. More preferably, in order to further increase the Q value, the film thickness of the LiTaO$_3$ film is equal to or less than about 2.5λ, for example.

Furthermore, as illustrated in FIG. 27, when the film thickness of the LiTaO$_3$ film is equal to or less than about 2.5λ, an absolute value of the temperature coefficient of frequency TCF can be made smaller than that in a case where the film thickness exceeds about 2.5λ. More preferably, the film thickness of the LiTaO₃ film is equal to or less than about 2λ, for example, and in this case, the absolute value of the temperature coefficient of frequency TCF may be made equal to or less than about 10 ppm/° C., for example. In order to decrease the absolute value of the temperature coefficient of frequency TCF, it is more preferable to set the film thickness of the LiTaO₃ film to be equal to or less than about 1.5λ, for example.

As illustrated in FIG. 28, when the film thickness of the LiTaO₃ film exceeds about 1.5λ, a change in the acoustic velocity is extremely small.

Figure 29:
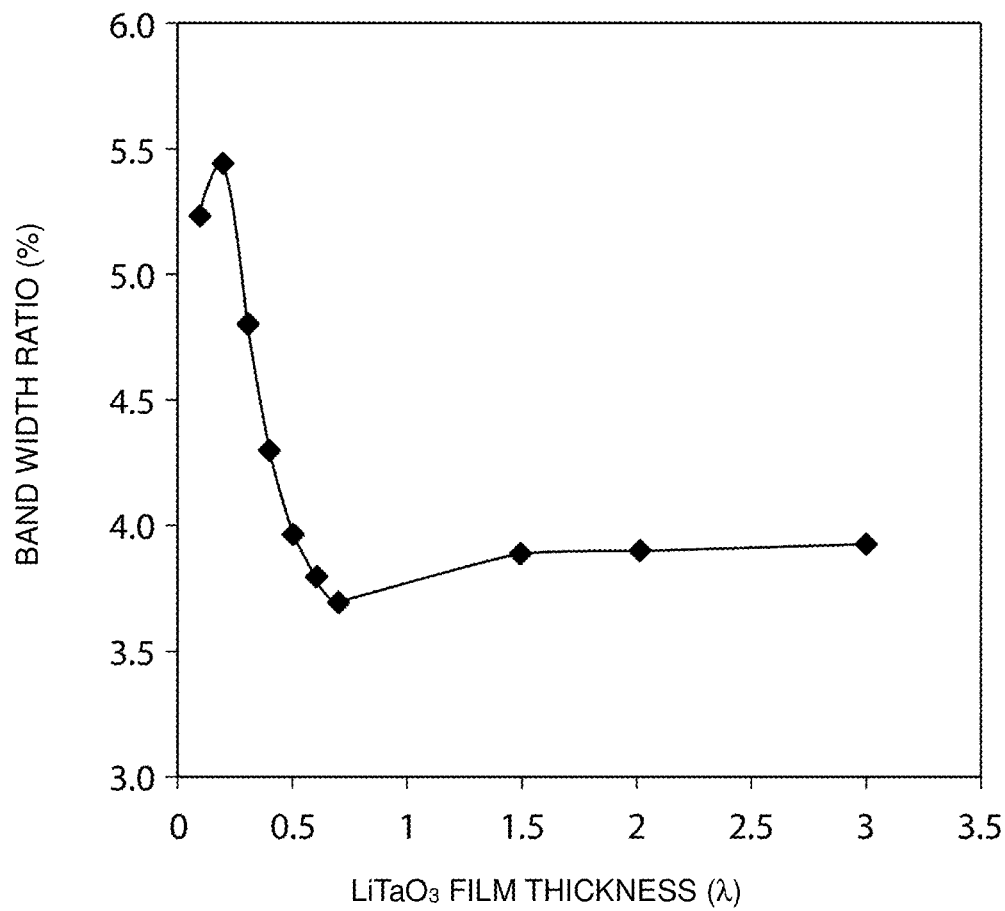
FIG. 29 is a diagram illustrating a relationship between a thickness of the piezoelectric body made of $LiTaO_3$ and a band width ratio.

However, as illustrated in FIG. 29, when the film thickness of the LiTaO₃ film is in a range of equal to or greater than about 0.05λ and equal to or less than about 0.5λ, for example, the band width ratio greatly changes. Accordingly, the electromechanical coupling coefficient can be adjusted in a wider range. Therefore, in order to widen the adjustment range of the electromechanical coupling coefficient and the band width ratio, it is preferable that the film thickness of the LiTaO₃ film is in a range of equal to or greater than about 0.05λ and equal to or less than about 0.5λ, for example.

Figure 30:
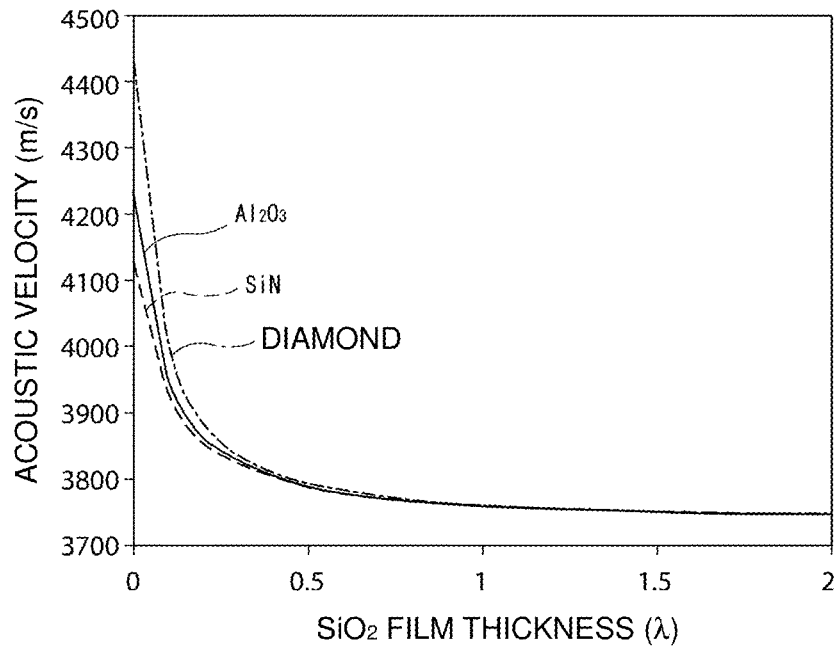
FIG. 30 is a diagram illustrating a relationship among a film thickness of an $SiO_2$ film, a material of a high acoustic velocity film, and the acoustic velocity.
Figure 31:
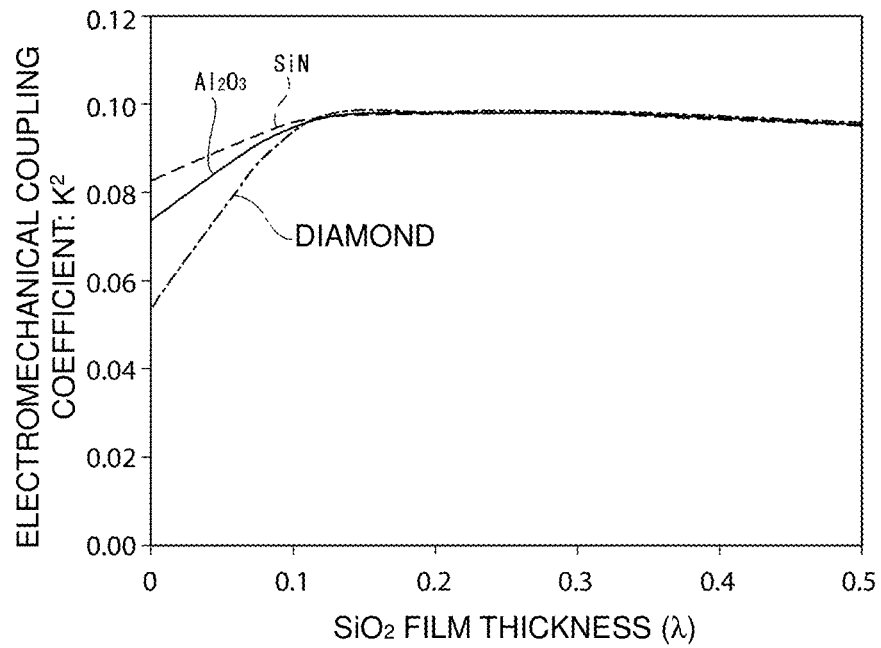
FIG. 31 is a diagram illustrating a relationship among the film thickness of the $SiO_2$ film, an electromechanical coupling coefficient, and the material of the high acoustic velocity film.

FIG. 30 and FIG. 31 are diagrams illustrating relationships between the film thickness (λ) of the SiO₂ film and the acoustic velocity and between the film thickness and the electromechanical coupling coefficient, respectively. Here, a silicon nitride film, an aluminum oxide film, and a diamond were each used as a high acoustic velocity film below the low acoustic velocity film made of SiO₂. The high acoustic velocity film is a film in which the acoustic velocity of the propagating bulk wave is higher than the acoustic velocity of the acoustic wave propagating through the piezoelectric body. The film thickness of the high acoustic velocity film was set to about 1.5λ, for example. The acoustic velocity of the bulk wave in silicon nitride is about 6000 m/s, the acoustic velocity of the bulk wave in aluminum oxide is about 6000 m/s, and the acoustic velocity of the bulk wave in diamond is about 12800 m/s. As illustrated in FIG. 30 and FIG. 31, even when the material of the high acoustic velocity film and the film thickness of the SiO₂ film are changed, the electromechanical coupling coefficient and the acoustic velocity are hardly changed. In particular, as illustrated in FIG. 31, when the film thickness of the SiO₂ film is equal to or greater than about 0.1λ and equal to or less than about 0.5λ, for example, the electromechanical coupling coefficient hardly changes regardless of the material of the high acoustic velocity film. Additionally, as illustrated in FIG. 30, it can be seen that, when the film thickness of the SiO₂ film is equal to or greater than about 0.3λ and equal to or less than about 2λ, for example, the acoustic velocity hardly changes regardless of the material of the high acoustic velocity film. Accordingly, preferably, the film thickness of the low acoustic velocity film made of silicon oxide is equal to or less than about 2λ, and more preferably, is equal to or less than about 0.5λ, for example.

The acoustic wave device in each of the above preferred embodiments can be used as a component, such as a duplexer of a high-frequency front end circuit. An example of such a high-frequency front end circuit will be described below.

Figure 32:
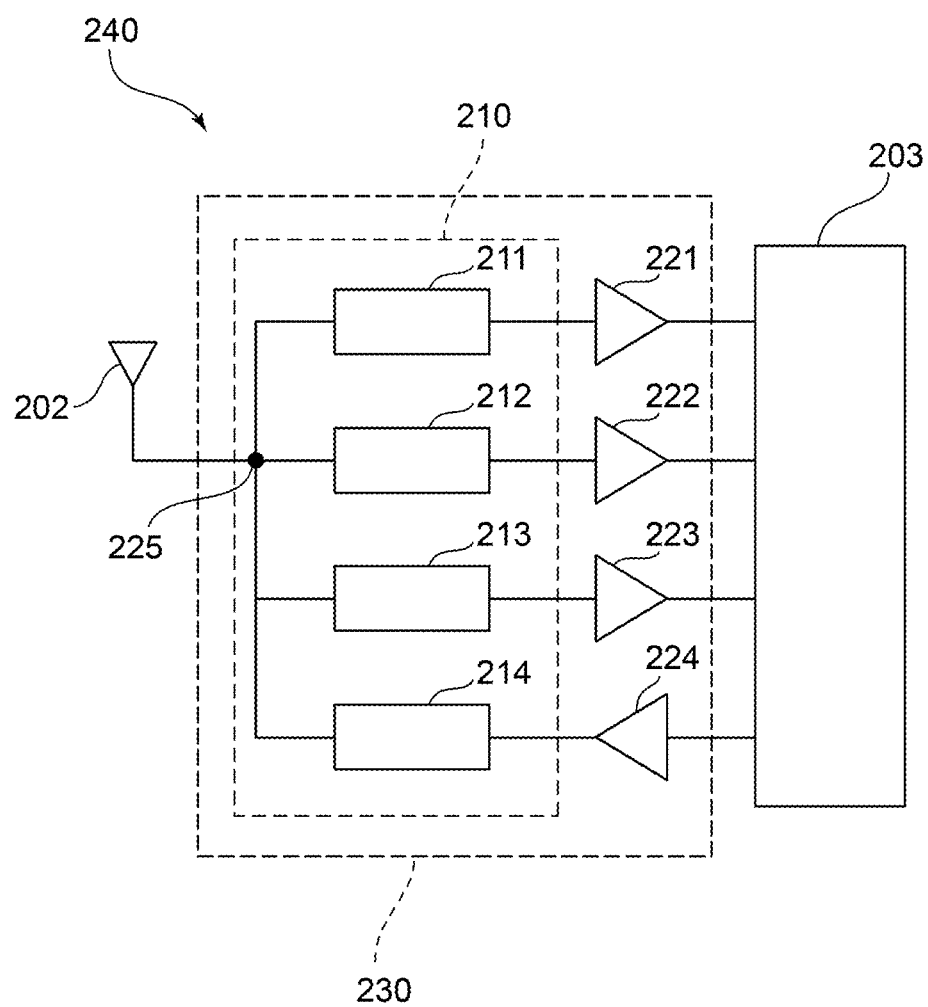
FIG. 32 is a schematic configuration diagram of a communication device having a high-frequency front end circuit which is a preferred embodiment of the present invention.

FIG. 32 is a schematic configuration diagram of a communication device including a high-frequency front end circuit. A communication device 240 includes an antenna 202, a high-frequency front end circuit 230, and an RF signal processing circuit 203. The high-frequency front end circuit 230 is connected to the antenna 202. The high-frequency front end circuit 230 includes a multiplexer 210 and amplifiers 221 to 224 as a power amplifier. The multiplexer 210 includes first to fourth filters 211 to 214. As the multiplexer 210, the multiplexer according to a preferred embodiment of the present invention described above can be used. The multiplexer 210 includes an antenna common terminal 225 connected to the antenna 202. One ends of the first to third filters 211 to 213 defining reception filters and one end of the fourth filter 214 defining a transmission filter are connected to the antenna common terminal 225 in common. Output ends of the first to third filters 211 to 213 are connected to the amplifiers 221 to 223, respectively. Furthermore, the amplifier 224 is connected to an input end of the fourth filter 214.

Output ends of the amplifiers 221 to 223 are connected to the RF signal processing circuit 203. An input end of the amplifier 224 is connected to the RF signal processing circuit 203.

A multiplexer according to a preferred embodiment of the present invention can be suitably used as the multiplexer 210 in the communication device 240 described above.

Note that the multiplexers according to preferred embodiments of the present invention may include only a plurality of transmission filters, or may include a plurality of reception filters. Note that the multiplexers according to preferred embodiments of the present invention include n band pass filters, and n is 2 or more. Accordingly, a duplexer is also a multiplexer according to a preferred embodiment of the present invention.

Preferred embodiments of the present invention can be widely used for communication apparatuses such as a cellular phone, for example, as a multiplexer applicable to a filter and a multi-band system, a front end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
N acoustic wave filters each including one end connected in common and having different pass bands, where, N is an integer equal to or greater than 2; wherein
when the N acoustic wave filters include a first acoustic wave filter, a second acoustic wave filter, . . . , and an N-th acoustic wave filter in order from a side of a lower frequency of the pass band, at least one acoustic wave filter n, where 1≤n<N, among the N acoustic wave filters excluding an acoustic wave filter having the highest frequency of the pass band includes one or more acoustic wave resonators;
a t-th acoustic wave resonator among the one or more acoustic wave resonators includes:
a support substrate having Euler angles ($\varphi_{Si}$, $\theta_{Si}$, $\psi_{Si}$) and made of silicon;
a silicon nitride film on the support substrate;
a silicon oxide film on the silicon nitride film;
a piezoelectric body on the silicon oxide film, having Euler angles ($\varphi_{LT}$ in a range of about 0° 5, $\theta_{LT}$, yLT in a range of about 0° 15), and made of lithium tantalate; and
an interdigital transducer (IDT) electrode on the piezoelectric body;

when a wavelength determined by an electrode finger pitch of the IDT electrode is denoted as λ in the t-th acoustic wave resonator, a thickness normalized by the wavelength λ is denoted as a wavelength normalized thickness, when setting values of $T_{LT}$ as a wavelength normalized thickness of the piezoelectric body, $\theta_{LT}$ as an Euler angle of the piezoelectric body, $T_S$ as a wavelength normalized thickness of the silicon oxide film, $T_N$ as a wavelength normalized thickness of the silicon nitride film, $T_E$ as a wavelength normalized thickness of the IDT electrode converted to a thickness of aluminum, obtained by a product of a value obtained by dividing a density of the IDT electrode by a density of aluminum and a wavelength normalized thickness of the IDT electrode, $\psi_{Si}$, as a propagation orientation in the support substrate, and $T_{Si}$ as a wavelength normalized thickness of the support substrate, at least one of frequencies $f_{hs\_t}^{(n)}$ of first, second, and third higher-order modes, where, s is 1, 2, or 3, and a case in which s is 1 indicates a frequency of the first higher-order mode, a case in which s is 2 indicates a frequency of the second higher-order mode, and a case in which s is 3 indicates a frequency of the third higher-order mode, determined by an expression (1) and an expression (2) below determined by the $T_{LT}$, the $\theta_{LT}$, the $T_S$, the $T_N$, the $T_E$, the $\psi_{Si}$, and the $T_{Si}$, and all m-th acoustic wave filters, wherein n<m≤N, each having a pass band of a higher frequency than a frequency of a pass band of the n-th acoustic wave filter satisfy an expression (3) or an expression (4) below:

$$V_h = a_{TLT}^{(3)}\left((T_{LT}+c_{TLT})^3 + b_{TLT}^{(3)}\right) + \\ a_{TLT}^{(2)}\left((T_{LT}+c_{TLT})^2 + b_{TLT}^{(2)}\right) + a_{TLT}^{(1)}(T_{LT}+c_{TLT}) + \\ a_{TS}^{(2)}\left((T_S+c_{TS})^2 + b_{TS}^{(2)}\right) + a_{TS}^{(1)}(T_S+c_{TS}) + \\ a_{TN}^{(2)}\left((T_N+c_{TN})^2 + b_{TN}^{(2)}\right) + a_{TN}^{(1)}(T_N+c_{TN}) + \\ a_{TE}^{(1)}(T_E+c_{TE}) + a_{\psi Si}^{(5)}\left((\psi_{Si}+c_{\psi Si})^5 + b_{\psi Si}^{(5)}\right) + \\ a_{\psi Si}^{(4)}\left((\psi_{Si}+c_{\psi Si})^4 + b_{\psi Si}^{(4)}\right) + a_{\psi Si}^{(3)}\left((\psi_{Si}+c_{\psi Si})^3 + b_{\psi Si}^{(3)}\right) + \\ a_{\psi Si}^{(2)}\left((\psi_{Si}+c_{\psi Si})^2 + b_{\psi Si}^{(2)}\right) + a_{\psi Si}^{(1)}(\psi_{Si}+c_{\psi Si}) + e;$$
Expression (1)

$$f_{hs\_t}^{(n)} = \frac{V_{hs\_t}}{\lambda_t^{(n)}}, (s=1,2,3);$$
Expression (2)

$$f_{hs\_t}^{(n)} > f_u^{(m)};$$
Expression (3)

$$f_{hs\_t}^{(n)} < f_l^{(m)};$$
Expression (4)

the $f_{hs\_t}^{(n)}$ represents a frequency of a higher-order mode corresponding to the s in the t-th acoustic wave resonator included in n-th the acoustic wave filter;

the $\lambda_t^{(n)}$ is a wavelength determined by the electrode finger pitch of the IDT electrode in the t-th acoustic wave resonator included in the n-th acoustic wave filter;

the $f_u^{(m)}$ is a frequency of a high band side end portion of the pass band in each of the m-th acoustic wave filters;

the $f_l^{(m)}$ is a frequency of a low band side end portion of the pass band in each of the m-th acoustic wave filters; and each coefficient in the expression (1) is each value shown in Table 1, Table 2, or Table 3 indicated below for each value of the s and each crystal orientation of the support substrate:

TABLE 1

| s = 1, First Higher-Order Mode | Si(100) | Si(110) | Si(111) |
|---|---|---|---|
| $a_{TLT}^{(3)}$ | 0 | 0 | 0 |
| $a_{TLT}^{(2)}$ | 0 | 0 | 0 |
| $a_{TLT}^{(1)}$ | −128.109974 | −84.392576 | −78.4352 |
| $b_{TLT}^{(3)}$ | 0 | 0 | 0 |
| $b_{TLT}^{(2)}$ | 0 | 0 | 0 |
| $c_{TLT}$ | −0.2492038 | −0.247604 | −0.24838 |
| $a_{TS}^{(2)}$ | 0 | 0 | 0 |
| $a_{TS}^{(1)}$ | −109.6889 | −182.2936559 | −485.867 |
| $b_{TS}^{(2)}$ | 0 | 0 | 0 |
| $c_{TS}$ | −0.249363 | −0.2498958 | −0.24942 |
| $a_{TN}^{(2)}$ | −337.59528 | −198.4171235 | −264.804 |
| $a_{TN}^{(1)}$ | −109.08389 | 38.137636 | −20.3216 |
| $b_{TN}^{(2)}$ | −0.0262274 | −0.04671597 | −0.04389 |
| $c_{TN}$ | −0.29617834 | 0.369166 | −0.34988 |
| $a_{TE}^{(1)}$ | 175.4682 | 13.0363945 | 0 |
| $c_{TE}$ | −0.14826 | −0.14979166 | 0 |
| $a_{\psi Si}^{(5)}$ | 0 | 0 | 0 |
| $a_{\psi Si}^{(4)}$ | 0 | 0.000489723 | 0.000503 |
| $a_{\psi Si}^{(3)}$ | 0.0236358 | −5.09E−05 | 0.006871 |
| $a_{\psi Si}^{(2)}$ | −0.0357088 | −1.01733189 | −0.80395 |
| $a_{\psi Si}^{(1)}$ | −34.8157175 | 0 | −5.57553 |
| $b_{\psi Si}^{(5)}$ | 0 | 0 | 0 |
| $b_{\psi Si}^{(4)}$ | 0 | −2150682.513 | −352545 |
| $b_{\psi Si}^{(3)}$ | 0 | −21460.18941 | 2095.94 |
| $b_{\psi Si}^{(2)}$ | −288.415605 | −36.8125 | −33.3025 |
| $c_{\psi Si}$ | −22.5 | −36.8125 | −33.3025 |
| e | 5251.687898 | 5092.365583 | 4851.236 |

TABLE 2

| s = 2, Second Higher-Order Mode | Si(100) | Si(110) | Si(111) |
|---|---|---|---|
| $a_{TLT}^{(3)}$ | 0 | 0 | 0 |
| $a_{TLT}^{(2)}$ | 2285.602094 | 3496.38329 | −2357.61 |
| $a_{TLT}^{(1)}$ | −538.88053 | −1081.86178 | −1308.55 |
| $b_{TLT}^{(3)}$ | 0 | 0 | 0 |
| $b_{TLT}^{(2)}$ | −0.0016565 | −0.001741462 | −0.00166 |
| $c_{TLT}$ | −0.251442 | −0.2501547 | −0.2497 |
| $a_{TS}^{(2)}$ | −3421.09725 | −4927.3017 | −3633.11 |
| $a_{TS}^{(1)}$ | −1054.253 | −992.33158 | −1006.69 |
| $b_{TS}^{(2)}$ | −0.0016565 | −0.2551083 | −0.00166 |
| $c_{TS}$ | −0.2514423 | 0.2551 | −0.25019 |
| $a_{TN}^{(2)}$ | 1042.56084 | −423.87007 | −135.325 |
| $a_{TN}^{(1)}$ | 159.11219 | 80.7948 | −106.73 |
| $b_{TN}^{(2)}$ | −0.02613905 | −0.05219411 | −0.0486 |
| $c_{TN}$ | −0.2961538 | −0.36996 | −0.39884 |
| $a_{TE}^{(1)}$ | −171.153846 | −637.391944 | −585.696 |
| $c_{TE}$ | 0.15 | −0.151238 | −0.14932 |
| $a_{\psi Si}^{(5)}$ | 0 | 0 | 0 |
| $a_{\psi Si}^{(4)}$ | 0 | −0.00098215 | −0.00016 |
| $a_{\psi Si}^{(3)}$ | −0.0038938 | −0.002109232 | −0.00037 |
| $a_{\psi Si}^{(2)}$ | −0.00306409 | 2.25463 | 0.224668 |
| $a_{\psi Si}^{(1)}$ | 2.8538478 | 23.6872514 | 1.243381 |
| $b_{\psi Si}^{(5)}$ | 0 | 0 | 0 |
| $b_{\psi Si}^{(4)}$ | 0 | −2959279.229 | −399785 |
| $b_{\psi Si}^{(3)}$ | 234.60436 | −21928.45828 | 5.712562 |
| $b_{\psi Si}^{(2)}$ | −289.82063 | −1407.041187 | −535.077 |
| $c_{\psi Si}$ | 22.78846 | −39.1640886 | −29.9806 |
| e | 5282.98076 | 5338.606811 | 5411.395 |

TABLE 3

| | s = 3, Third Higher-Order Mode | | |
|---|---|---|---|
| | Si(100) | Si(110) | Si(111) |
| $a_{TLT}^{(3)}$ | 0 | 0 | 0 |
| $a_{TLT}^{(2)}$ | 0 | 0 | 3595.754 |
| $a_{TLT}^{(1)}$ | −782.3425 | −1001.237815 | −592.246 |
| $b_{TLT}^{(3)}$ | 0 | 0 | 0 |
| $b_{TLT}^{(2)}$ | 0 | 0 | −0.00164 |
| $c_{TLT}$ | −0.254819 | −0.2578947 | −0.25367 |
| $a_{TS}^{(2)}$ | −14897.59116 | 0 | 0 |
| $a_{TS}^{(1)}$ | −599.8312 | −686.9212563 | −438.155 |
| $b_{TS}^{(2)}$ | −0.00162005 | 0 | 0 |
| $c_{TS}$ | −0.25682 | −0.25546558 | −0.25562 |
| $a_{TN}^{(2)}$ | 0 | 0 | 0 |
| $a_{TN}^{(1)}$ | 0 | 125.557557 | 15.72663 |
| $b_{TN}^{(2)}$ | 0 | 0 | 0 |
| $c_{TN}$ | 0 | −0.349392713 | −0.40872 |
| $a_{TE}^{(1)}$ | −154.8823 | −764.8758717 | −290.54 |
| $c_{TE}$ | −0.14819277 | −0.15303646 | −0.15149 |
| $a_{\psi Si}^{(5)}$ | 0 | 0 | 0 |
| $a_{\psi Si}^{(4)}$ | 0 | 0 | −0.00073 |
| $a_{\psi Si}^{(3)}$ | 0.010467682 | −0.000286554 | −0.00318 |
| $a_{\psi Si}^{(2)}$ | −0.196913569 | 0.67197739 | 0.969126 |
| $a_{\psi Si}^{(1)}$ | −0.3019959 | 0.197549 | 0.359421 |
| $b_{\psi Si}^{(5)}$ | 0 | 0 | 0 |
| $b_{\psi Si}^{(4)}$ | 0 | −0.000204665 | 0 |
| $b_{\psi Si}^{(3)}$ | 0 | −14837.92017 | 670.2052 |
| $b_{\psi Si}^{(2)}$ | −240.3687037 | −1590.306348 | −525.572 |
| $c_{\psi Si}$ | 24.4578313 | −41.9028 | −31.1239 |
| e | 5730.906036 | 5574.008097 | 5675.837. |

2. The multiplexer according to claim 1, wherein the wavelength normalized thickness $T_{Si}$ of the support substrate satisfies $T_{Si}$>about 4.

3. The multiplexer according to claim 2, wherein $T_{Si}$>about 10 is satisfied.

4. The multiplexer according to claim 3, wherein $T_{Si}$>about 20 is satisfied.

5. The multiplexer according to claim 1, wherein the wavelength normalized thickness of the piezoelectric body is equal to or less than about 3.5λ.

6. The multiplexer according to claim 5, wherein the wavelength normalized thickness of the piezoelectric body is equal to or less than about 2.5λ.

7. The multiplexer according to claim 5, wherein the wavelength normalized thickness of the piezoelectric body is equal to or less than about 1.5λ.

8. The multiplexer according to claim 5, wherein the wavelength normalized thickness of the piezoelectric body is equal to or less than about 0.5λ.

9. The multiplexer according to claim 1, further comprising:
an antenna terminal to which one ends of the plurality of acoustic wave filters are connected in common; wherein
the multiplexer is a composite filter in which three or more acoustic wave filters are connected in common on a side of the antenna terminal.

10. The multiplexer according to claim 9, wherein the multiplexer is a composite filter device for carrier aggregation.

11. The multiplexer according to claim 1, wherein the values of the $T_{LT}$, the $\theta_{LT}$, the $T_S$, the $T_N$, the $T_E$, the $\psi_{Si}$, and the $T_{Si}$, are selected such that the frequencies $f_{hs\_t}^{(n)}$ of the first and second higher-order modes satisfy the expression (3) or the expression (4).

12. The multiplexer according to claim 1, wherein the values of the $T_{LT}$, the $\theta_{LT}$, the $T_S$, the $T_N$, the $T_E$, the $\psi_{Si}$, and the $T_{Si}$, are selected such that the frequencies $f_{hs\_t}^{(n)}$ of the first and third higher-order modes satisfy the expression (3) or the expression (4).

13. The multiplexer according to claim 1, wherein the values of the $T_{LT}$, the $\theta_{LT}$, the $T_S$, the $T_N$, the $T_E$, the $\psi_{Si}$, and the $T_{Si}$, are selected such that the frequencies $f_{hs\_t}^{(n)}$ of the second and third higher-order modes satisfy the expression (3) or the expression (4).

14. The multiplexer according to claim 1, wherein the values of the $T_{LT}$, the $\theta_{LT}$, the $T_S$, the $T_N$, the $T_E$, the $\psi_{Si}$, and the $T_{Si}$, are selected such that all the frequencies $f_{hs\_t}^{(n)}$ of the first, second, and third higher-order modes satisfy the expression (3) or the expression (4).

15. The multiplexer according to claim 1, the multiplexer further comprising:
an antenna terminal to which one ends of the plurality of acoustic wave filters are connected in common; wherein
the acoustic wave resonator satisfying the expression (3) or the expression (4) is an acoustic wave resonator of the one or more acoustic wave resonators which is closest to the antenna terminal.

16. The multiplexer according to claim 1, wherein all of the one or more acoustic wave resonators are each the acoustic wave resonator satisfying the expression (3) or the expression (4).

17. The multiplexer according to claim 1, wherein the multiplexer is a duplexer.

18. The multiplexer according to claim 1, wherein the acoustic wave filter including the one or more acoustic wave resonators is a ladder filter including a plurality of serial arm resonators and a plurality of parallel arm resonators.

19. A multiplexer comprising:
N acoustic wave filters each including one end connected in common and having different pass bands, where, N is an integer equal to or greater than 2; wherein
when the N acoustic wave filters include a first acoustic wave filter, a second acoustic wave filter, and . . . , an N-th acoustic wave filter in order from a side of a lower frequency of the pass band, at least one n-th acoustic wave filter, wherein 1≤n<N, among the N acoustic wave filters excluding an acoustic wave filter having the highest frequency of the pass band includes one or more acoustic wave resonators;
a t-th acoustic wave resonator among the one or more acoustic wave resonators includes:
a support substrate having Euler angles ($\varphi_{Si}$, $\theta_{Si}$, $\psi_{Si}$) and made of silicon;
a silicon nitride film on the support substrate;
a silicon oxide film on the silicon nitride film;
a piezoelectric body on the silicon oxide film, having Euler angles ($\varphi_{LT}$ in a range of about 0°±5°, $\theta_{LT}$, $\psi_{LT}$ in a range of about 0°±15°), and made of lithium tantalate; and
an interdigital transducer (IDT) electrode on the piezoelectric body;
when a wavelength determined by an electrode finger pitch of the IDT electrode is denoted as λ in the t-th acoustic wave resonator, a thickness normalized by the wavelength λ is denoted as a wavelength normalized thickness, when setting values of $T_{LT}$ as a wavelength normalized thickness of the piezoelectric body, $\theta_{LT}$ as an Euler angle of the piezoelectric body, $T_S$ as a wavelength normalized thickness of the silicon oxide film, $T_N$ as a wavelength normalized thickness of the silicon nitride film, $T_E$ as a wavelength normalized thickness of the IDT electrode converted to a thickness of aluminum, obtained by a product of a value obtained by dividing a density of the IDT electrode by a density of aluminum and a wavelength normalized thickness of the IDT electrode, $\psi_{Si}$ as a propagation orientation in the support substrate, and $T_{Si}$ as a wavelength normalized thickness of the support substrate, at least one of frequencies $f_{hs\_t}^{(n)}$ of first, second, and third higher-order modes, where s is 1, 2, or 3, and a case in which s is 1 indicates a frequency of the first higher-order mode, a case in which s is 2 indicates a frequency of the second higher-order mode, and a case in which s is 3 indicates a frequency of the third higher-order mode, determined by an expression (5) and an expression (2) below determined by the $T_{LT}$, the $\theta_{LT}$, the $T_S$, the $T_N$, the $T_E$, the $\psi_{Si}$, and the $T_{Si}$, and all m-th acoustic wave filters (n<m≤N) each having a pass band of a higher frequency than a frequency of a pass band of the n-th acoustic wave filter satisfy an expression (3) or an expression (4)

$$V_h = a_{T_{LT}}^{(2)}\left((T_{LT} - c_{T_{LT}})^2 - b_{T_{LT}}^{(2)}\right) + a_{T_{LT}}^{(1)}(T_{LT} - c_{T_{LT}}) +$$
$$a_S^{(2)}\left((T_S - c_{T_S})^2 - b_{T_S}^{(2)}\right) + a_{T_S}^{(1)}(T_S - c_{T_S}) +$$
$$a_{T_N}^{(3)}\left((T_N - c_{T_N})^3 - b_{T_N}^{(3)}\right) + a_{T_N}^{(2)}\left((T_N - c_{T_N})^2 - b_{T_N}^{(2)}\right) +$$
$$a_{T_N}^{(1)}(T_N - c_{T_N}) + a_{T_E}^{(1)}(T_E - c_{T_E}) +$$
$$a_{\psi_{Si}}^{(4)}\left((\psi_{Si} - c_{\psi_{Si}})^4 - b_{\psi_{Si}}^{(4)}\right) + a_{\psi_{Si}}^{(3)}\left((\psi_{Si} - c_{\psi_{Si}})^3 - b_{\psi_{Si}}^{(3)}\right) +$$
$$a_{\psi_{Si}}^{(2)}\left((\psi_{Si} - c_{\psi_{Si}})^2 - b_{\psi_{Si}}^{(2)}\right) + a_{\psi_{Si}}^{(1)}(\psi_{Si} - c_{\psi_{Si}}) +$$
$$a_{\theta_{LT}}^{(1)}(\theta_{LT} - c_{\theta_{LT}}) + d_{T_{LT}T_S}(T_{LT} - c_{T_{LT}})(T_S - c_{T_S}) +$$
$$d_{T_{LT}T_N}(T_{LT} - c_{T_{LT}})(T_N - c_{T_N}) +$$
$$d_{T_{LT}\psi_{Si}}(T_{LT} - c_{T_{LT}})(\psi_{Si} - c_{\psi_{Si}}) +$$
$$d_{T_S T_N}(T_S - c_{T_S})(T_N - c_{T_N}) +$$
$$d_{T_N\psi_{Si}}(T_N - c_{T_N})(\psi_{Si} - c_{\psi_{Si}}) +$$
$$d_{T_N\theta_{LT}}(T_N - c_{T_N})(\theta_{LT} - c_{\theta_{LT}}) +$$
$$d_{T_E\psi_{Si}}(T_E - c_{T_E})(\psi_{Si} - c_{\psi_{Si}}) +$$
$$d_{\psi_{Si}\theta_{LT}}(\psi_{Si} - c_{\psi_{Si}})(\theta_{LT} - c_{\theta_{LT}}) + e;$$

Expression (5)

$$f_{hs\_t}^{(n)} = \frac{V_{hs\_t}}{\lambda_t^{(n)}}, (s = 1, 2, 3);$$ Expression (2)

$$f_{hs\_t}^{(n)} > f_u^{(m)};$$ Expression (3)

$$f_{hs\_t}^{(n)} < f_l^{(m)};$$ Expression (3)

the $f_{hs\_t}^{(n)}$ represents a frequency of a higher-order mode corresponding to the s in the t-th acoustic wave resonator included in the n-th acoustic wave filter;

the $\lambda_t^{(n)}$ is a wavelength determined by the electrode finger pitch of the IDT electrode in the t-th acoustic wave resonator included in the n-th acoustic wave filter;

the $f_u^{(m)}$ is a frequency of a high band side end portion of the pass band in each of the m-th acoustic wave filters;

the $f_l^{(m)}$ is a frequency of a low band side end portion of the pass band in each of the m-th acoustic wave filters; and each coefficient in the expression (5) is each value shown in Table 4, Table 5, or Table 6 below for each value of the s and each crystal orientation of the support substrate:

TABLE 4

| s = 1, First Higher-Order Mode | Si(100) | Si(110) | Si(111) |
|---|---|---|---|
| $a_{TLT}^{(2)}$ | 0 | 0 | 0 |
| $a_{TLT}^{(1)}$ | 0 | 0 | 0 |
| $b_{TLT}^{(2)}$ | 0 | 0 | 0 |
| $c_{TLT}$ | 0 | 0 | 0 |
| $a_{TS}^{(2)}$ | 0 | 0 | 0 |
| $a_{TS}^{(1)}$ | 0 | 0 | 534.5188318 |
| $b_{TS}^{(2)}$ | 0 | 0 | 0 |
| $c_{TS}$ | 0 | 0 | 0.249010293 |
| $a_{TN}^{(3)}$ | 0 | 0 | 0 |
| $a_{TN}^{(2)}$ | 0 | 0 | 0 |
| $a_{TN}^{(1)}$ | 0 | 0 | −36.51741324 |
| $b_{TN}^{(3)}$ | 0 | 0 | 0 |
| $b_{TN}^{(2)}$ | 0 | 0 | 0 |
| $c_{TN}$ | 0 | 0 | 0.35114806 |
| $a_{TE}^{(1)}$ | 0 | 0 | 0 |
| $c_{TE}$ | 0 | 0 | 0 |
| $a_{\psi Si}^{(4)}$ | 0 | 0 | 0.000484609 |
| $a_{\psi Si}^{(3)}$ | 0.022075968 | 0 | 0.005818261 |
| $a_{\psi Si}^{(2)}$ | −0.18782287 | 0.081701713 | −0.805302371 |
| $a_{\psi Si}^{(1)}$ | −33.85785847 | 10.57201342 | −4.785681077 |
| $b_{\psi Si}^{(4)}$ | 0 | 0 | 351437.8188 |
| $b_{\psi Si}^{(3)}$ | 806.2400011 | 0 | −1862.605341 |
| $b_{\psi Si}^{(2)}$ | 270.2635345 | 986.4812738 | 471.945355 |
| $c_{\psi Si}$ | 20.26171875 | 37.73795535 | 32.87410926 |
| $a_{\theta LT}^{(1)}$ | 0 | 0 | 0 |
| $c_{\theta LT}$ | 0 | 0 | 0 |
| $d_{TLTTS}$ | 0 | 0 | 0 |
| $d_{TLTTN}$ | 0 | 0 | 0 |
| $d_{TLT\psi Si}$ | 0 | 0 | 0 |
| $d_{TSTN}$ | 0 | 0 | 1862.994192 |
| $d_{TN\psi Si}$ | 0 | 0 | 0 |
| $d_{TN\theta LT}$ | 0 | 0 | 0 |
| $d_{TE\psi Si}$ | 0 | 0 | 0 |
| $d_{\psi Si\theta LT}$ | 0 | 0 | 0 |
| e | 5317.859375 | 5103.813161 | 4853.204861 |

TABLE 5

| s = 2, Second Higher-Order Mode | Si(100) | Si(110) | Si(111) |
|---|---|---|---|
| $a_{TLT}^{(2)}$ | 0 | 0 | 0 |
| $a_{TLT}^{(1)}$ | −608.2898721 | −1003.471473 | −1270.018362 |
| $b_{TLT}^{(2)}$ | 0 | 0 | 0 |
| $c_{TLT}$ | 0.25 | 0.253954306 | 0.249121666 |
| $a_{TS}^{(2)}$ | 0 | 0 | 0 |
| $a_{TS}^{(1)}$ | −1140.654415 | −1030.75867 | −1039.830158 |
| $b_{TS}^{(2)}$ | 0 | 0 | 0 |
| $c_{TS}$ | 0.249966079 | 0.255272408 | 0.250032531 |
| $a_{TN}^{(3)}$ | −3219.596725 | 0 | 2822.963403 |
| $a_{TN}^{(2)}$ | 555.8662451 | 0 | −264.9680504 |
| $a_{TN}^{(1)}$ | 465.8636149 | 53.04201209 | −288.9461645 |
| $b_{TN}^{(3)}$ | 0.001081155 | 0 | 0.000392787 |
| $b_{TN}^{(2)}$ | 0.04654949 | 0 | 0.48934743 |
| $c_{TN}$ | 0.378426052 | 0.376449912 | 0.392908263 |
| $a_{TE}^{(1)}$ | 0 | −622.7635558 | −614.5885324 |
| $c_{TE}$ | 0 | 0.151274165 | 0.156815224 |
| $a_{\psi Si}^{(4)}$ | 0 | −0.00096736 | −0.000227305 |
| $a_{\psi Si}^{(3)}$ | 0 | −0.006772454 | −0.00220017 |
| $a_{\psi Si}^{(2)}$ | 0 | 2.203099663 | 0.31727324 |
| $a_{\psi Si}^{(1)}$ | 0.833288758 | 28.15768206 | 0.648998523 |
| $b_{\psi Si}^{(4)}$ | 0 | 2959964.533 | 396965.3474 |
| $b_{\psi Si}^{(3)}$ | 0 | 19143.61126 | 87.44425969 |
| $b_{\psi Si}^{(2)}$ | 0 | 1447.367657 | 532.0008856 |
| $c_{\psi Si}$ | 22.51017639 | 40.50966608 | 29.90240729 |
| $a_{\theta LT}^{(1)}$ | −1.501270796 | −2.076046604 | −2.376979261 |
| $c_{\theta LT}$ | −52.08683853 | −50.82249561 | −49.04879636 |
| $d_{TLTTS}$ | 0 | 0 | 0 |

TABLE 5-continued

| s = 2, Second Higher-Order Mode | Si(100) | Si(110) | Si(111) |
|---|---|---|---|
| $d_{TLTTN}$ | 0 | 0 | 0 |
| $d_{TLT\psi Si}$ | 0 | 16.61849238 | 0 |
| $d_{TSTN}$ | 0 | 1820.795615 | 1482.11565 |
| $d_{TN\psi Si}$ | 0 | 3.625908485 | −3.131543418 |
| $d_{TN\theta LT}$ | 0 | 0 | 1607.412093 |
| $d_{TE\psi Si}$ | 0 | 0 | 0 |
| $d_{\psi Si\theta LT}$ | 0 | 0 | 0.089566113 |
| e | 5326.187246 | 5356.110093 | 5418.323508 |

TABLE 6

| s = 3, Third Higher-Order Mode | Si(100) | Si(110) | Si(111) |
|---|---|---|---|
| $a_{TLT}^{(2)}$ | −14710.45271 | 0 | 0 |
| $a_{TLT}^{(1)}$ | −764.4056124 | −942.2882121 | −582.1313356 |
| $b_{TLT}^{(2)}$ | 0.001558682 | 0 | 0 |
| $c_{TLT}$ | 0.257243963 | 0.255679719 | 0.251712062 |
| $a_{TS}^{(2)}$ | −21048.18754 | 0 | 0 |
| $a_{TS}^{(1)}$ | −508.6730943 | −705.5211128 | −400.0368899 |
| $b_{TS}^{(2)}$ | 0.001583662 | 0 | 0 |
| $c_{TS}$ | 0.257243963 | 0.254751848 | 0.254357977 |
| $a_{TN}^{(3)}$ | 0 | 0 | 0 |
| $a_{TN}^{(2)}$ | 0 | 0 | 0 |
| $a_{TN}^{(1)}$ | 0 | 97.59462013 | 24.94240828 |
| $b_{TN}^{(3)}$ | 0 | 0 | 0 |
| $b_{TN}^{(2)}$ | 0 | 0 | 0 |
| $c_{TN}$ | 0 | 0.367793031 | 0.404280156 |
| $a_{TE}^{(1)}$ | −276.7311066 | −747.0884117 | 0 |
| $c_{TE}$ | 0.1494796 | 0.152164731 | 0 |
| $a_{\psi Si}^{(4)}$ | 0 | 0 | −0.00075146 |
| $a_{\psi Si}^{(3)}$ | 0.011363183 | 0.003532214 | −0.002666357 |
| $a_{\psi Si}^{(2)}$ | −0.23320473 | 0.218669312 | 1.006728665 |
| $a_{\psi Si}^{(1)}$ | 0.214067146 | −11.24365221 | 0.523191515 |
| $b_{\psi Si}^{(4)}$ | 0 | 0 | 381500.5075 |
| $b_{\psi Si}^{(3)}$ | 180.0564368 | 20914.04622 | −493.6094588 |
| $b_{\psi Si}^{(2)}$ | 257.0498426 | 1548.182277 | 530.6814032 |
| $c_{\psi Si}$ | 22.31890092 | 39.72544879 | 30.82490272 |
| $a_{\theta LT}^{(1)}$ | 0 | 0 | −1.551626054 |
| $c_{\theta LT}$ | 0 | 0 | −49.16731518 |
| $d_{TLTTS}$ | −13796.64706 | 0 | 1575.283126 |
| $d_{TLTTN}$ | 0 | 0 | 0 |
| $d_{TLT\psi Si}$ | 30.35701585 | 0 | 0 |
| $d_{TSTN}$ | 0 | 0 | 0 |
| $d_{TN\psi Si}$ | 0 | 0 | 0 |
| $d_{TN\theta LT}$ | 0 | 0 | 0 |
| $d_{TE\psi Si}$ | 28.27908094 | 0 | 0 |
| $d_{\psi Si\theta LT}$ | 0 | 0 | −0.086544362 |
| e | 5700.075407 | 5563.854277 | 5688.418884. |

* * * * *